US012563921B2

(12) United States Patent
Lee et al.

(10) Patent No.: US 12,563,921 B2
(45) Date of Patent: Feb. 24, 2026

(54) DISPLAY PANEL AND DISPLAY DEVICE

(71) Applicant: LG Display Co., Ltd., Seoul (KR)

(72) Inventors: SeungHyun Lee, Paju-si (KR); Mihee Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 651 days.

(21) Appl. No.: 17/973,145

(22) Filed: Oct. 25, 2022

(65) Prior Publication Data

US 2023/0172017 A1 Jun. 1, 2023

(30) Foreign Application Priority Data

Dec. 1, 2021 (KR) ......................... 10-2021-0169801

(51) Int. Cl.
H10K 59/131 (2023.01)
(52) U.S. Cl.
CPC .................................. H10K 59/131 (2023.02)
(58) Field of Classification Search
CPC ................................................... H10K 59/131
USPC ........................................................ 313/498
See application file for complete search history.

(56) References Cited

U.S. PATENT DOCUMENTS

2021/0191552 A1* 6/2021 Bok ...................... H10K 59/38

FOREIGN PATENT DOCUMENTS

KR 10-2021-0082316 A 7/2021

* cited by examiner

*Primary Examiner* — James R Greece
*Assistant Examiner* — Hana S Featherly
(74) *Attorney, Agent, or Firm* — Birch, Stewart, Kolasch & Birch, LLP

(57) ABSTRACT

A display device including a display panel including a plurality of light emitting areas; a first optical electronic device located under the display panel; a second optical electronic device located under the display panel. Further, a first optical area of the display panel overlapping the first optical electronic device comprises a plurality of first light transmission areas in addition to the plurality of light emitting areas, a second optical area of the display panel overlapping the second optical electronic device comprises a plurality of second light transmission areas in addition the plurality of light emitting areas, and a third optical area of the display panel not overlapping the first and second optical electronic devices includes the plurality of light emitting areas without including the first and second light transmission areas. In addition, the first optical area includes zigzag rows of the light emitting areas and zigzag rows of first horizontal signal lines overlapping the zigzag rows of the light emitting areas.

20 Claims, 19 Drawing Sheets

Front View Side View

Front View      Side View

Left Side View          Front View          Right Side View

Left Side View          Front View          Right Side View

DISPLAY PANEL AND DISPLAY DEVICE

CROSS-REFERENCE TO RELATED APPLICATION

This application claims the priority benefit of Republic of Korea Patent Application No. 10-2021-0169801, filed on Dec. 1, 2021, in the Korean Intellectual Property Office, the entire contents of which are hereby incorporated by reference in its entirety into the present application.

BACKGROUND OF THE DISCLOSURE

Technical Field

The present disclosure relates to electronic devices, and more particularly, to a display panel and a display device that are capable of improving the transmittance of an area in which an optical device is disposed.

Description of the Related Art

Display devices provide functions including an image capture function, a sensing function, in addition to an image display function. The display device thus includes an optical electronic device, such as a camera, a sensor for detecting an image, and the like. In addition, the optical electronic device is located in a front portion of the display device where incident light can be advantageously received or detected. However, installing the optical electronic device in such an implementation increases the bezel size of the display device and requires a notch or a hole can in a display area where the optical device is installed.

SUMMARY OF THE DISCLOSURE

Accordingly, one aspect of the present disclosure is to address the above noted and other problems.

Another aspect of the present invention is to provide a display device including one or more optical electronic devices without reducing an area of a display area.

Another aspect of the present disclosure is to provide a display device with an optical electronic device located under the display panel and without being visible in the front surface of the display device.

In another aspect, the present disclosure provides a display panel and a display device including an optical electronic device disposed to have a high transmittance.

In still another aspect, the present disclosure provides a display panel and a display device that reduces a non-display area of the display panel and enables an optical electronic device such as a camera, a sensor, and/or the like not to be visible in the front surface of the display panel by disposing the optical electronic device under the display area, or in a lower portion, of the display panel.

In another aspect, the present disclosure provides a display panel and a display device having a light transmission structure for enabling an optical electronic device under the display area, or in a lower portion, of the display panel to normally receive or detect light transmitting through the display panel.

In yet another aspect, the present disclosure provides a display panel and a display device that normally performs display driving in an optical area included in a display area of the display panel and overlapping the optical electronic device.

To achieve these and other aspects, the present disclosure provides a display device including a display area including a first optical area and a normal area located outside of the first optical area, and a non-display area in addition to a plurality of signal lines. The first optical area can includes a plurality of light emitting areas and a plurality of first transmission areas, and the normal area can includes a plurality of light emitting areas. Further, the light emitting areas disposed in the first optical area are disposed in a plurality of rows, and two or more light emitting areas among the light emitting areas in each row are disposed in a zigzag shape. A plurality of first horizontal lines extend from the normal area up to the first optical area, and one or more of the plurality of first horizontal lines in the first optical area overlap one or more of the plurality of light emitting areas and have a zigzag shape.

The present disclosure also provides a display panel having a display area including a first optical area and a normal area located outside of the first optical area, and a non-display area; and a plurality of signal lines. The first optical area includes a plurality of light emitting areas and a plurality of first transmission areas, and the normal area includes the light emitting areas. The plurality of light emitting areas disposed in the first optical area can be disposed in a plurality of rows, and two or more light emitting areas among the plurality of light emitting areas in each of the plurality of rows can be disposed in a zigzag shape. Also, a plurality of first horizontal lines extend from the normal area up to the first optical area, and one or more of the plurality of first horizontal lines in the first optical area can overlap one or more of the plurality of light emitting areas and have a zigzag shape. A plurality of vertical lines are also disposed in the normal area and the first optical area, and at least one branch pattern bifurcated from at least one vertical line among the plurality of vertical lines can overlap at least one of the light emitting areas of the first optical area.

According to one or more embodiments of the present disclosure, a display panel and a display device can be provided that are capable of reducing a non-display area of the display panel and enabling an optical electronic device such as a camera, a sensor, and/or the like not to be exposed in the front surface of the display panel by disposing the optical electronic device under a display area, or in a lower portion, of the display panel. Further, a display panel and a display device can be provided that include a plurality of first horizontal lines having a zigzag shape, and thereby, are capable of facilitating light emitting in light emitting areas and improving transmittance in an optical area.

Also, a display panel and a display device can be provided that have a light transmission structure for enabling an optical electronic device under the display area, or in a lower portion, of the display panel to normally receive or detect light transmitting the display panel. Further, a display panel and a display device can be provided that are capable of normally performing display driving in an optical area included in a display area of the display panel and overlapping an optical electronic device.

Additional features and aspects will be set forth in part in the description which follows and in part will become apparent from the description or can be learned by practice of the inventive concepts provided herein. Other features and an aspect of the inventive concepts can be realized and attained by the structure particularly pointed out in, or derivable from, the written description, the claims hereof, and the appended drawings. Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims. It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of the disclosure, illustrate an aspect of the disclosure and together with the description serve to explain principles of the disclosure. In the drawings.

DETAILED DESCRIPTION OF THE EMBODIMENTS

Figure 1A:
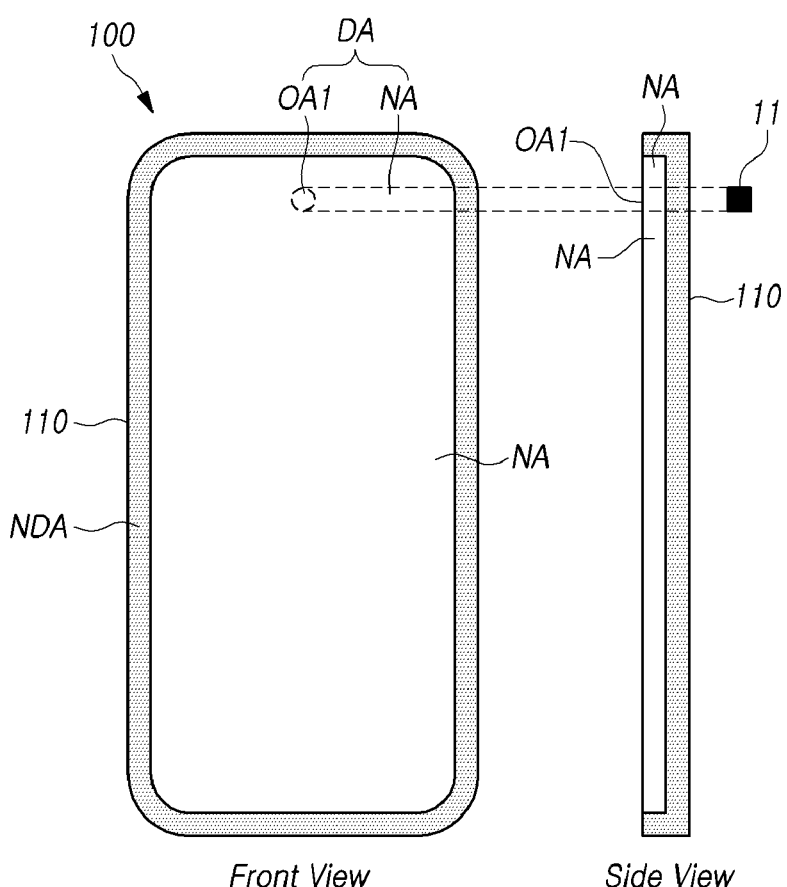
FIGS. 1A, 1B, 1C and 1D are plan views illustrating a display device according to an aspect of the present disclosure.

Reference will now be made in detail to embodiments of the present disclosure, examples of which can be illustrated in the accompanying drawings. In the following description, the structures, embodiments, implementations, methods and operations described herein are not limited to the specific example or examples set forth herein and can be changed as is known in the art, unless otherwise specified. Names of the respective elements used in the following explanations are selected only for convenience of writing the specification and can thus be different from those used in actual products.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals designate like elements throughout, unless otherwise specified. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the protected scope of the present disclosure is defined by claims and their equivalents. In the following description, where the detailed description of the relevant known function or configuration can unnecessarily obscure an aspect of the present disclosure, a detailed description of such known function or configuration can be omitted. Where the terms "comprise," "have," "include," "contain," "constitute," "make up of," "formed of," and the like are used, one or more other elements can be added unless the term, such as "only," is used. An element described in the singular form is intended to include a plurality of elements, and vice versa, unless the context clearly indicates otherwise. Singular forms used herein are intended to include plural forms unless the context clearly indicates otherwise.

In construing an element, the element is to be construed as including an error or tolerance range even where no explicit description of such an error or tolerance range is provided. Where positional relationships are described, for example, where the positional relationship between two parts is described using "on," "over," "under," "above," "below," "beside," "next," or the like, one or more other parts can be located between the two parts unless a more limiting term, such as "immediate(ly)," "direct(ly)," or "close(ly)" is used. For example, where an element or layer is disposed "on" another element or layer, a third element or layer can be interposed therebetween. Furthermore, the terms "left," "right," "top," "bottom," "downward," "upward," "upper," "lower," and the like refer to an arbitrary frame of reference. Time relative terms, such as "after", "subsequent to", "next to", "before", or the like, used to describe a temporal relationship between events, operations, or the like are generally intended to include events, situations, cases, operations, or the like that do not occur consecutively unless the terms, such as "directly", "immediately", or the like, are used.

In describing a temporal relationship, when the temporal order is described as, for example, "after," "subsequent," "next," or "before," a case which is not continuous can be included unless a more limiting term, such as "just," "immediate(ly)," or "direct(ly)," is used. When signal flows are discussed, for example, the transmission of a signal from node A to node B can include the transmission of the signal from node A to node B by way of another node unless 'direct' or 'directly' is used.

Although the terms "first," "second," A, B, (a), (b), and the like can be used herein to describe various elements, these elements should not be interpreted to be limited by these terms as they are not used to define a particular order or precedence. These terms are merely used herein for distinguishing an element from other elements. The expression of a first element, a second elements "and/or" a third element should be understood as one of the first, second and third elements or as any or all combinations of the first, second and third elements.

By way of example, A, B and/or C can refer to only A, only B, or only C; any or some combination of A, B, and C; or all of A, B, and C. Therefore, a first element mentioned below can be a second element in a technical concept of the present disclosure. Further, the term "may" fully encompasses all the meanings of the term "can."

The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

A size of each component illustrated in the drawing are illustrated for convenience of description, and the present disclosure is not limited to the size of the component illustrated. The features of various embodiments of the present disclosure can be partially or entirely combined with each other and can be operated in technically various ways, and the embodiments can be carried out independently of or in association with each other.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" can apply, for example, to a separate circuit or structure, an integrated circuit, a computational block of a circuit device, or any structure configured to perform a described function as should be understood to one of ordinary skill in the art.

Hereinafter, with reference to the accompanying drawings, various embodiments of the present disclosure will be described in detail. FIGS. 1A-1D are plan views illustrating an example display device 100 according to an aspect of the present disclosure. Referring to FIGS. 1A-1D, the display device 100 includes a display panel 110 for displaying images, and one or more optical electronic devices 11 and/or 12.

As shown, the display panel 110 includes a display area DA in which an image is displayed and a non-display area NDA in which an image is not displayed. A plurality of subpixels are also arranged in the display area DA, and several types of signal lines for driving the plurality of subpixels are arranged therein.

In addition, the non-display area NDA refers to an area outside of the display area DA. Several types of signal lines are arranged in the non-display area NDA, and several types of driving circuits are connected thereto. At least a portion of the non-display area NDA can also be bent to be invisible from the front of the display panel or can be covered by a case of the display panel 110 or the display device 100. The non-display area NDA can be also referred to as a bezel or a bezel area.

Referring to FIGS. 1A-1D, the one or more optical electronic devices 11 and/or 12 are located under, or in a lower portion of, the display panel 110 (an opposite side to the viewing surface thereof). Thus, light can enter the front surface (viewing surface) of the display panel 110, pass through the display panel 110, and reach one or more optical electronic devices 11 and/or 12 located under, or in the lower portion of, the display panel 110 (the opposite side of the viewing surface).

Further, the optical electronic devices 11 and/or 12 can receive or detect light transmitting through the display panel 110 and perform a predefined function based on the received light. For example, the optical electronic devices 11 and/or 12 can include one or more of the following: an image capture device such as a camera (an image sensor), and/or the like; or a sensor such as a proximity sensor, an illuminance sensor, and/or the like.

Referring to FIGS. 1A-1D, the display area DA includes one or more optical areas OA1 and/or OA2 and a normal area NA. Herein, the term "normal area" NA is an area that while being present in the display area DA, does not overlap with one or more optical electronic devices 11 and/or 12 and can also be referred to as a non-optical area.

As shown, the optical areas OA1 and/or OA2 are areas overlapping the optical electronic devices 11 and/or 12. According to an example of FIG. 1A, the display area DA includes a first optical area OA1 and a normal area NA. In this example, at least a portion of the first optical area OA1 can overlap a first optical electronic device 11.

Figure 1B:
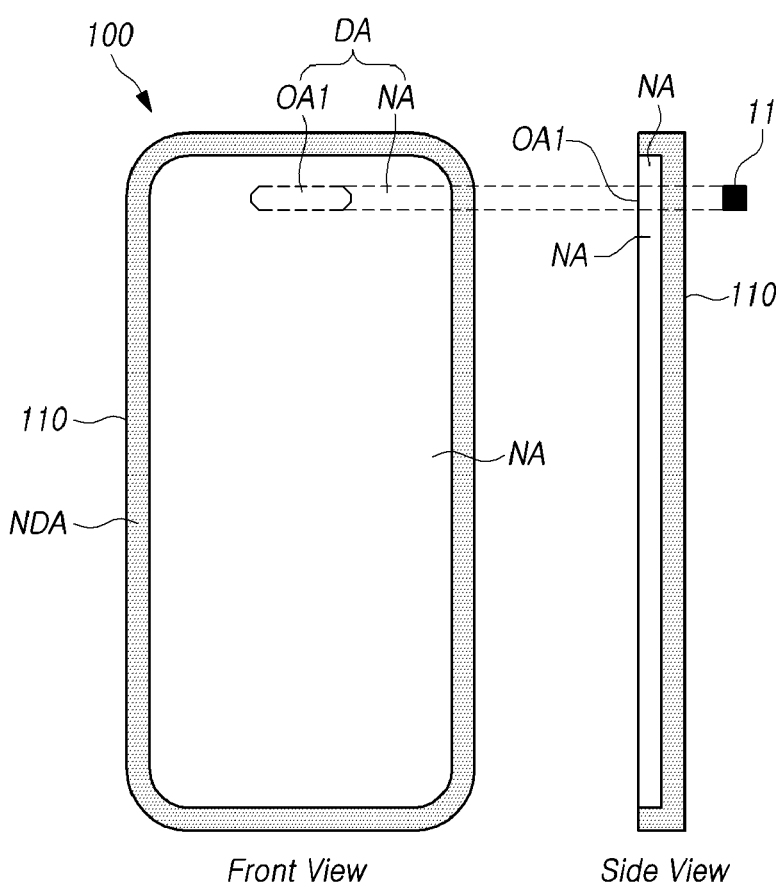

Although FIG. 1A illustrates the first optical area OA1 has a circular shape, the shape of the first optical area OA1 according to embodiments of the present disclosure is not limited thereto. For example, as shown in FIG. 1B, the first optical area OA1 can have an octagonal shape, or various polygonal shapes.

Figure 1C:
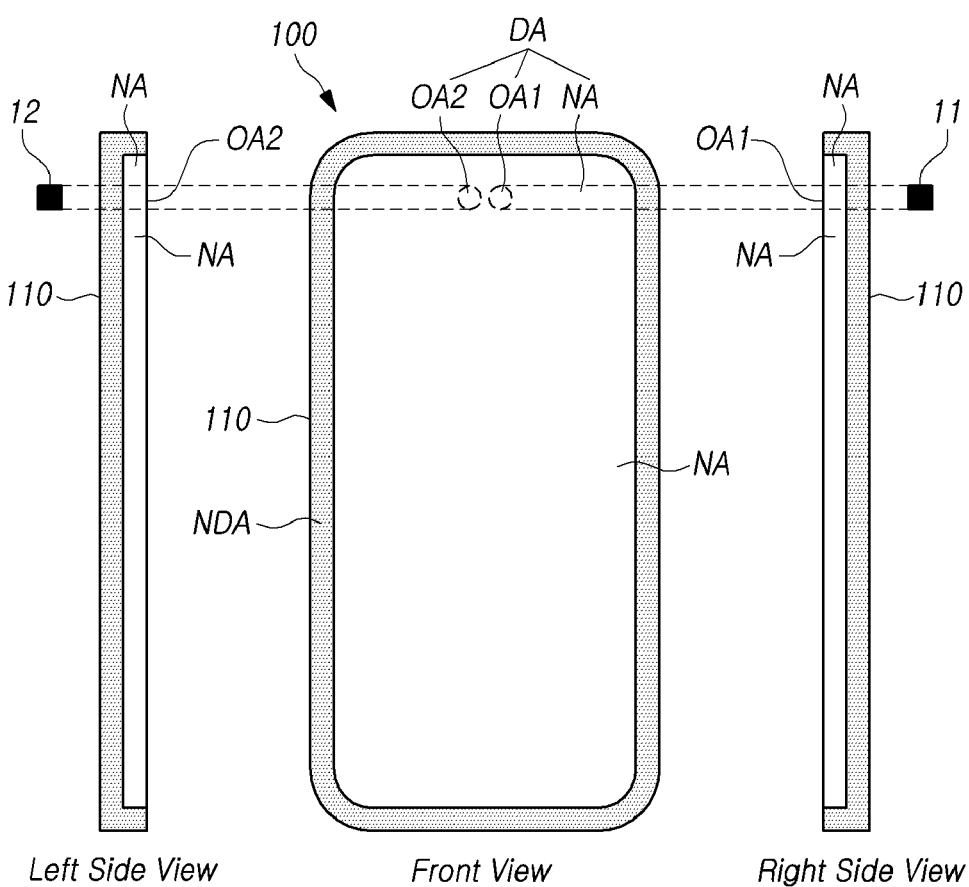

According to an example of FIG. 1C, the display area DA includes a first optical area OA1, a second optical area OA2, and a normal area NA. Also, at least a portion of the normal area NA can be present between the first and second optical areas OA1 and OA2. In this example, at least a portion of the first optical area OA1 can overlap the first optical electronic device 11, and at least a portion of the second optical area OA2 can overlap a second optical electronic device 12.

Figure 1D:
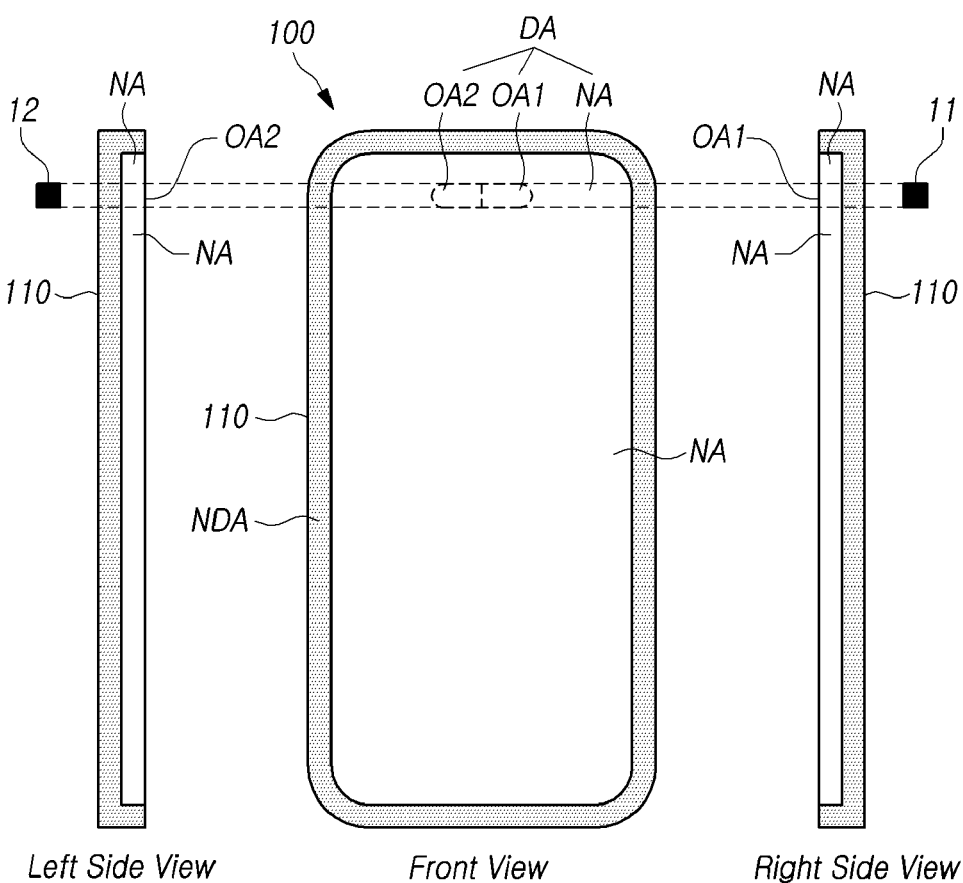

According to an example of FIG. 1D, the display area DA includes a first optical area OA1, a second optical area OA2, and a normal area NA. As shown, the normal area NA is not present between the first and second optical areas OA1 and OA2. For example, the first and second optical areas OA1 and OA2 can contact each other (e.g., directly contact each other). In this example, at least a portion of the first optical area OA1 can overlap the first optical electronic device 11, and at least a portion of the second optical area OA2 can overlap the second optical electronic device 12.

In addition, an image display structure and a light transmission structure are preferably formed in the optical areas OA1 and/or OA2. For example, because the optical areas OA1 and/or OA2 are a portion of the display area DA, subpixels for displaying an image are disposed in the optical areas OA1 and/or OA2. Further, to enable light to transmit the optical electronic devices 11 and/or 12, a light transmission structure is formed in the optical areas OA1 and/or OA2.

Even though the optical electronic devices 11 and/or 12 need to receive or detect light, the optical electronic devices 11 and/or 12 can be located on the back of the display panel 110 (e.g., on an opposite side of a viewing surface). In this embodiment, the optical electronic devices 11 and/or 12 are located, for example, under, or in a lower portion of, the display panel 110, and are configured to receive light that has transmitted through the display panel 110.

In more detail, the optical electronic devices 11 and/or 12 are not exposed in the front surface (viewing surface) of the display panel 110. Accordingly, when a user looks at the front of the display device 100, the optical electronic devices 11 and/or 12 are not visible. In one embodiment, the first optical electronic device 11 can be a camera, and the second optical electronic device 12 can be a sensor such as a proximity sensor, an illuminance sensor, an infrared sensor, etc. For example, the camera can be a camera lens, an image sensor, or a unit including at least one of the camera lens and the image sensor. Further, the sensor can be, for example, an infrared sensor capable of detecting infrared rays. In another embodiment, the first optical electronic device 11 can be a sensor, and the second optical electronic device 12 can be a camera.

Hereinafter, the first optical electronic device 11 is referred to as a camera, and the second optical electronic device 12 is referred to as a sensor. However, the first optical electronic device 11 can be the sensor, and the second optical electronic device 12 can be the camera. In addition, the camera can be a camera lens, an image sensor, or a unit including at least one of the camera lens and the image sensor.

The first optical electronic device 11 (a camera) is located on the back of (e.g., under, or in a lower portion of) the display panel 110, and is a front camera capturing objects or images in a front direction of the display panel 110. Accordingly, the user can capture an image or object through the camera that is invisible to the user on the viewing surface of the display panel 110.

In addition, FIGS. 1A-1D illustrate the normal area NA and the optical areas OA1 and/or OA2 as being capable of displaying images. However, a light transmission structure can be omitted in the normal area NA, but provided in the optical areas OA1 and/or OA2. Thus, in some embodiments, the light transmission structure can be omitted in the normal area NA, and provided in the optical areas OA1 and/or OA2.

Accordingly, the optical areas OA1 and/or OA2 can have a transmittance greater than or equal to a predetermined level, i.e., a relatively high transmittance, and the normal area NA can have a light transmittance less than the predetermined level i.e., a relatively low transmittance. For example, the optical areas OA1 and/or OA2 can have a resolution, a subpixel arrangement structure, the number of subpixels per unit area, an electrode structure, a line structure, an electrode arrangement structure, a line arrangement structure, or/and the like different from that/those of the normal area NA.

In one embodiment, the number of subpixels per unit area in the optical areas OA1 and/or OA2 can be smaller than the number of subpixels per unit area in the normal area NA. For example, the resolution of the optical areas OA1 and/or OA2 can be lower than that of the normal area NA. Here, the number of subpixels per unit area can is a unit for measuring resolution, for example, referred to as pixels (or subpixels) per inch (PPI), which represents the number of pixels within 1 inch.

In FIGS. 1A-1D, the number of subpixels per unit area in the first optical areas OA1 can be smaller than the number of subpixels per unit area in the normal area NA. Further, the number of subpixels per unit area in the second optical areas OA2 can be greater than or equal to the number of subpixels per unit area in the first optical areas OA1.

In addition, in FIGS. 1A-1D, the first optical area OA1 can have various shapes, such as a circle, an ellipse, a quadrangle, a hexagon, an octagon or the like. In FIGS. 1C and 1D, the second optical area OA2 can have various shapes, such as a circle, an ellipse, a quadrangle, a hexagon, an octagon or the like. The first and second optical areas OA1 and OA2 can also have the same shape or different shapes. Referring to FIG. 1C, when the first and second optical areas OA1 and OA2 contact each other, the entire optical area including the first and second optical areas OA1 and OA2 can also have various shapes, such as a circle, an ellipse, a quadrangle, a hexagon, an octagon or the like.

Hereinafter, the first and second optical areas OA1 and OA2 are referred to as having a circular shape. However, one or both of the first and second optical areas OA1 and OA2 can have a shape other than a circular shape.

In addition, the display device 100 including the first optical electronic device 11 (camera) located under or in the lower portion of the display panel 110 without being exposed to the outside can is referred to as a display or display device to which an under-display camera (UDC) technology is applied. The display device 100 according to this configuration prevents the size of the display area DA from being reduced due to a notch or a camera hole formed in the display panel 110.

Also, the bezel size can be reduced and the degree of freedom in design is improved. As described above, even though the optical electronic devices 11 and/or 12 are placed under the display and are invisible or hidden, the optical electronic devices 11 and/or 12 still need to receive or detect light for performing their functions functionality.

Further, image display still needs to be normally performed in the optical areas OA1 and/or OA2 overlapping the optical electronic devices 11 and/or 12. The present disclosure describes different embodiments for performing image display and optical electronic device functionality even though the optical electronic device is disposed under the display panel.

Figure 2:
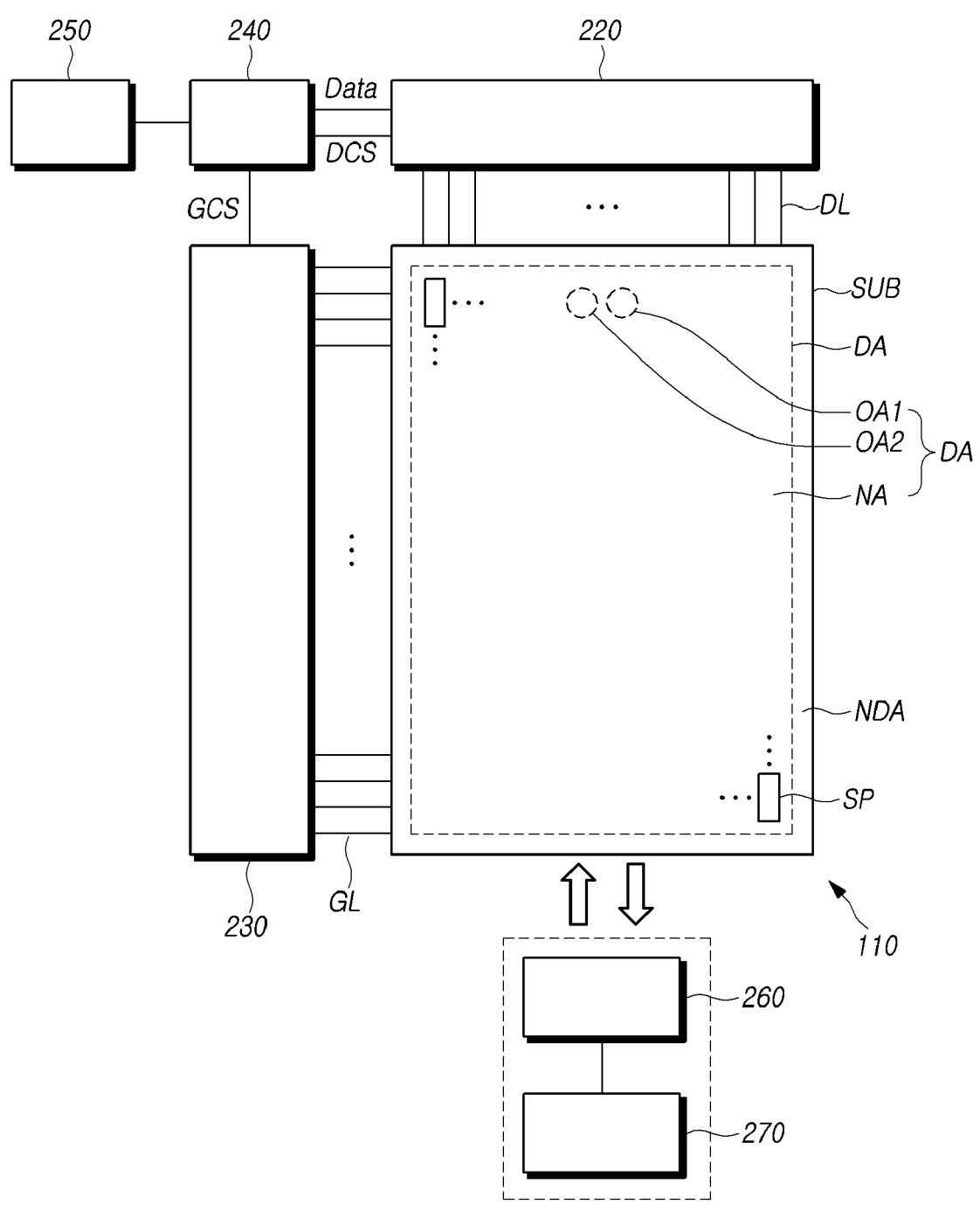
FIG. 2 is a block diagram illustrating a system configuration of the display device according to an aspect of the present disclosure.

Next, FIG. 2 is a block diagram illustrating the display device 100 according to an aspect of the present disclosure. Referring to FIG. 2, the display device 100 includes the display panel 110 and a display driving circuit for displaying an image. The display driving circuit drives the display panel 110, and includes a data driving circuit 220, a gate driving circuit 230, a display controller 240, and other components.

The display panel 110 includes a display area DA in which an image is displayed and a non-display area NDA in which an image is not displayed. The non-display area NDA is an area outside of the display area DA, and can also be referred to as an edge area or a bezel area. All or a portion of the non-display area NDA is an area visible from the front surface of the display device 100, or an area that is not visible from the front surface of the display device 100 as a corresponding portion is bent.

FIG. 2 also illustrates the display panel 110 including a substrate SUB and a plurality of subpixels SP disposed on the substrate SUB. The display panel 110 further includes various types of signal lines to drive the subpixels SP. In some embodiments, the display device 100 can be a liquid crystal display device or the like, or a self-emission display device in which light is emitted from the display panel 110 itself. When the display device 100 is the self-emission display device, the pixels SP include a light emitting element.

In addition, the display device 100 can be an organic light emitting display device in which the light emitting element is implemented using an organic light emitting diode (OLED). The display device 100 can also be an inorganic light emitting display device in which the light emitting element is implemented using an inorganic material-based light emitting diode, or a quantum dot display device in which the light emitting element is implemented using quantum dots, which are self-emission semiconductor crystals.

The structure of each pixel SP can vary according to types of the display devices 100. When the display device 100 is a self-emission display device including self-emission subpixels SP, each subpixel SP can include a self-emission light emitting element, transistors, and capacitors. The various types of signal lines arranged in the display device 100 can include, for example, data lines DL for carrying data signals (which can be referred to as data voltages or image signals), gate lines GL for carrying gate signals (which can be referred to as scan signals), and the like.

The data lines DL and gate lines GL can also intersect each other. In more detail, each data line DL can extend in a first direction, and each gate line GL can extend in a second direction. For example, the first direction can be a column or vertical direction, and the second direction can be a row or horizontal direction. In another example, the first direction can be the row direction, and the second direction can be the column direction.

In addition, the data driving circuit 220 is for driving the data lines DL, and supplies data signals to the data lines DL. Also, the gate driving circuit 230 is for driving the gate lines GL, and supplies gate signals to the gate lines GL. Further, the display controller 240 is a device for controlling the data driving circuit 220 and the gate driving circuit 230, and controls a driving timing for the data lines DL and the gate lines GL.

The display controller 240 can also supply a data driving control signal DCS to the data driving circuit 220 to control the data driving circuit 220, and supply a gate driving control signal GCS to the gate driving circuit 230 to control the gate driving circuit 230. In addition, the display controller 240 can receive input image data from a host system 250 and supply image data to the data driving circuit 220 based on the input image data.

Further, the data driving circuit 220 can supply data signals to the data lines DL according to the driving timing control of the display controller 240, and can receive the digital image data Data from the display controller 240, convert the received image data Data into analog data signals, and supply the resulting analog data signals to the plurality of data lines DL.

In addition, the gate driving circuit 230 can supply gate signals to the gate lines GL according to a timing control of the display controller 240. The gate driving circuit 230 can also receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In some embodiments, the data driving circuit 220 can be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type. In addition, the gate driving circuit 230 can be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type.

Further, the gate driving circuit 230 can be disposed in the non-display area NDA of the display panel 110 in a gate in panel (GIP) type. The gate driving circuit 230 can also be disposed on or over the substrate, or connected to the substrate. That is, for the GIP type, the gate driving circuit 230 can be disposed in the non-display area NDA of the substrate. The gate driving circuit 230 can also be connected to the substrate for the chip on glass (COG) type, the chip on film (COF) type, or the like.

In addition, at least one of the data driving circuit 220 and the gate driving circuit 230 can be disposed in the display area DA of the display panel 110. For example, at least one of the data driving circuit 220 and the gate driving circuit 230 can be disposed not to overlap subpixels SP, or disposed to be overlapped with one or more, or all, of the subpixels SP.

Further, the data driving circuit 220 can also be located on, but not limited to, only one side or portion (e.g., an upper edge or a lower edge) of the display panel 110. In some embodiments, the data driving circuit 220 can be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

In addition, the gate driving circuit 230 can be located in only one side or portion (e.g., a left edge or a right edge) of the display panel 110. In some embodiments, the gate driving circuit 230 can be connected to two sides or portions (e.g., a left edge and a right edge) of the display panel 110, or be connected to at least two of four sides or portions (e.g., an upper edge, a lower edge, the left edge, and the right edge) of the display panel 110 according to driving schemes, panel design schemes, or the like.

Further, the display controller 240 can be implemented in a separate component from the data driving circuit 220, or integrated with the data driving circuit 220 and thus implemented in an integrated circuit. The display controller 240 can also be a timing controller used in display technology or a controller or a control device capable of performing other control functions in addition to the function of the timing controller. In some embodiments, the display controller 140 can be a controller or a control device different from the timing controller, or a circuitry or a component included in the controller or the control device. The display controller 240 can also be implemented with various circuits or electronic components such as an integrated circuit (IC), a field programmable gate array (FPGA), an application specific integrated circuit (ASIC), a processor, and/or the like.

In addition, the display controller 240 can be mounted on a printed circuit board, a flexible printed circuit, etc. and be electrically connected to the gate driving circuit 230 and the data driving circuit 220 through the printed circuit board, flexible printed circuit, etc. The display controller 240 can also transmit signals to, and receive signals from, the data driving circuit 220 via predefined interfaces. In some embodiments, such interfaces can include a low voltage differential signaling (LVDS) interface, an embedded clock point-point interface (EPI), a serial peripheral interface (SPI), and the like.

In addition, to further provide a touch sensing function, as well as an image display function, the display device 100 can include at least one touch sensor, and a touch sensing circuit capable of detecting whether a touch event occurs by a touch object such as a finger, a pen, or the like, or of detecting a corresponding touch position, by sensing the touch sensor. The touch sensing circuit can include a touch driving circuit 260 capable of generating and providing touch sensing data by driving and sensing the touch sensor, a touch controller 270 capable of detecting the occurrence of a touch event or detecting a touch position using the touch sensing data, and one or more other components.

Further, the touch sensor can include a plurality of touch electrodes and a plurality of touch lines for electrically connecting the touch electrodes to the touch driving circuit 260. The touch sensor can be implemented in a touch panel, or in the form of a touch panel, outside of the display panel 110, or be implemented inside of the display panel 110. When the touch sensor is implemented in the touch panel, or in the form of the touch panel, outside of the display panel 110, such a touch sensor is referred to as an add-on type. When the add-on type of touch sensor is disposed, the touch panel and the display panel 110 can be separately manufactured and coupled during an assembly process. The add-on type of touch panel can also include a touch panel substrate and a plurality of touch electrodes on the touch panel substrate.

When the touch sensor is implemented inside of the display panel 110, a process of manufacturing the display panel 110 can include disposing the touch sensor over the substrate SUB together with signal lines and electrodes related to driving the display device 100. The touch driving circuit 260 can supply a touch driving signal to at least one of the touch electrodes, and sense at least one of the touch electrodes to generate touch sensing data.

In addition, the touch sensing circuit can perform touch sensing using a self-capacitance sensing technique or a mutual-capacitance sensing technique. When the touch sensing circuit performs touch sensing in the self-capacitance sensing technique, the touch sensing circuit can perform touch sensing based on capacitance between each touch electrode and a touch object (e.g., a finger, a pen, and the like).

According to the self-capacitance sensing technique, each touch electrode can serve as both a driving touch electrode and a sensing touch electrode. The touch driving circuit 260 can drive all, or one or more, of the plurality of touch electrodes and sense all, or one or more, of the touch electrodes. When the touch sensing circuit performs touch sensing in the mutual-capacitance sensing technique, the touch sensing circuit can perform touch sensing based on capacitance between touch electrodes.

According to the mutual-capacitance sensing technique, the touch electrodes are divided into driving touch electrodes and sensing touch electrodes. The touch driving circuit 260 can drive the driving touch electrodes and sense the sensing touch electrodes. In addition, the touch driving circuit 260 and the touch controller 270 included in the touch sensing circuit can be implemented in separate devices or in a single device. Further, the touch driving circuit 260 and the data driving circuit 220 can be implemented in separate devices or in a single device.

Further, the display device 100 includes a power supply circuit for supplying various types of power to the display driving circuit and/or the touch sensing circuit. In some embodiments, the display device 100 can be a mobile terminal such as a smart phone, a tablet, or the like, or a monitor, a television (TV), or the like. Such devices can be of various types, sizes, and shapes. The display device 100 according to embodiments of the present disclosure are not limited thereto, and includes displays of various types, sizes, and shapes for displaying information or images.

As described above, the display area DA of the display panel 110 can include a normal area NA and optical areas OA1 and/or OA2, for example, as shown in FIGS. 1A-1D.

The normal area NA and the optical areas OA1 and/or OA2 are areas where an image can be displayed. However, the light transmission structure can be omitted in the normal area NA, and disposed in the optical areas OA1 and/or OA2.

In addition, the following description describes the display area DA including first and second optical areas OA1 and OA2 and the normal area NA, as in FIGS. 1C and 1D; the normal area NA thereof including the normal areas NAs in FIGS. 1A-1D, and the first and second optical areas OA1 and/or OA2 including the first optical areas OA1s in FIGS. 1A-1D and the second optical areas OA2s of FIGS. 1C and 1D, respectively, unless explicitly stated otherwise.

Figure 3:
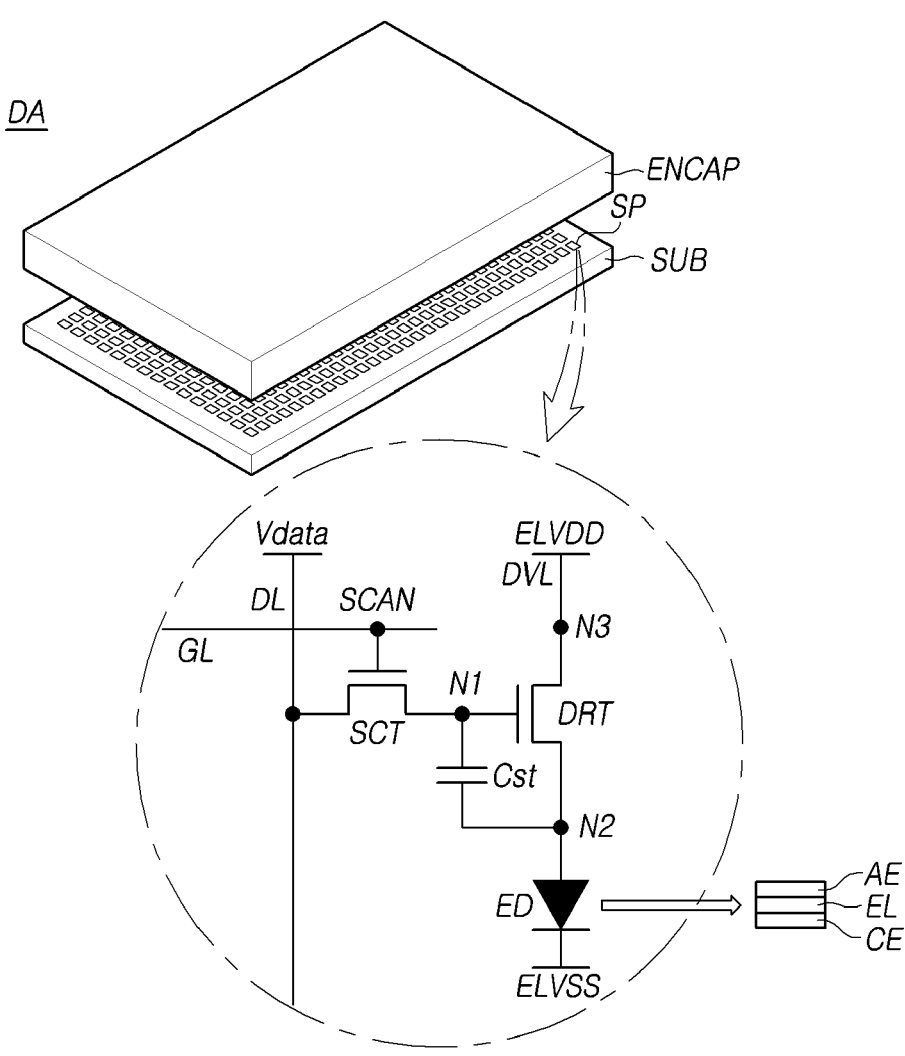
FIG. 3 is an overview illustrating an equivalent circuit of a subpixel in a display panel according to an aspect of the present disclosure.

Next, FIG. 3 is an overview illustrating an equivalent circuit of a subpixel SP in the display panel 110 according to an aspect of the present disclosure. Each subpixel SP disposed in the normal area NA, the first optical area OA1, and the second optical area OA2 included in the display area can include a light emitting element ED, a driving transistor DRT for driving the light emitting element ED, a scan transistor SCT for transmitting a data voltage Vdata to a first node N1 of the driving transistor DRT, a storage capacitor Cst for maintaining a voltage at an approximate constant level during one frame, and the like.

In addition, as shown, the driving transistor DRT includes the first node N1 to which a data voltage is applied, a second node N2 electrically connected to the light emitting element ED, and a third node N3 to which a driving voltage ELVDD through a driving voltage line DVL is applied. In the driving transistor DRT, the first node N1 can be a gate node, the second node N2 can be a source node or a drain node, and the third node N3 can be the drain node or the source node.

Further, the light emitting element ED can include an anode electrode AE, an emission layer EL, and a cathode electrode CE. The anode electrode AE can be a pixel electrode disposed in each subpixel SP, and can be electrically connected to the second node N2 of the driving transistor DRT of each subpixel SP. In addition, the cathode electrode CE can be a common electrode commonly disposed in the subpixels SP, and a base voltage ELVSS such as a low-level voltage can be applied to the cathode electrode CE.

For example, the anode electrode AE can be the pixel electrode, and the cathode electrode CE can be the common electrode. In another example, the anode electrode AE can be the common electrode, and the cathode electrode CE can be the pixel electrode. The following description assumes the anode electrode AE is the pixel electrode, and the cathode electrode CE is the common electrode unless explicitly stated otherwise.

In addition, the light emitting element ED can be, for example, an organic light emitting diode (OLED), an inorganic light emitting diode, a quantum dot light emitting element, or the like. When an organic light emitting diode is used as the light emitting element ED, the emission layer EL included in the light emitting element ED includes an organic emission layer including an organic material.

Further, the scan transistor SCT can be turned on and off by a scan signal SCAN that is a gate signal applied through a gate line GL, and be electrically connected between the first node N1 of the driving transistor DRT and a data line DL. The storage capacitor Cst can also be electrically connected between the first node N1 and the second node N2 of the driving transistor DRT. Each subpixel SP can include two transistors (2T: DRT and SCT) and one capacitor (1C: Cst) (which can be referred to as a "2T1C structure") as shown in FIG. 3, and in some instances, can further include one or more transistors, or one or more capacitors.

In some embodiments, the storage capacitor Cst, which is provided between the first node N1 and the second node N2 of the driving transistor DRT, can be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like). Each of the driving transistor DRT and the scan transistor SCT can also be an n-type transistor or a p-type transistor.

Because the circuit elements (e.g., in particular, a light emitting element ED) in each subpixel SP are vulnerable to external moisture or oxygen, an encapsulation layer ENCAP can be disposed in the display panel 110 to prevent the external moisture or oxygen from penetrating into the circuit elements (e.g., in particular, the light emitting element ED). The encapsulation layer ENCAP can be disposed to cover the light emitting element ED.

Figure 4:
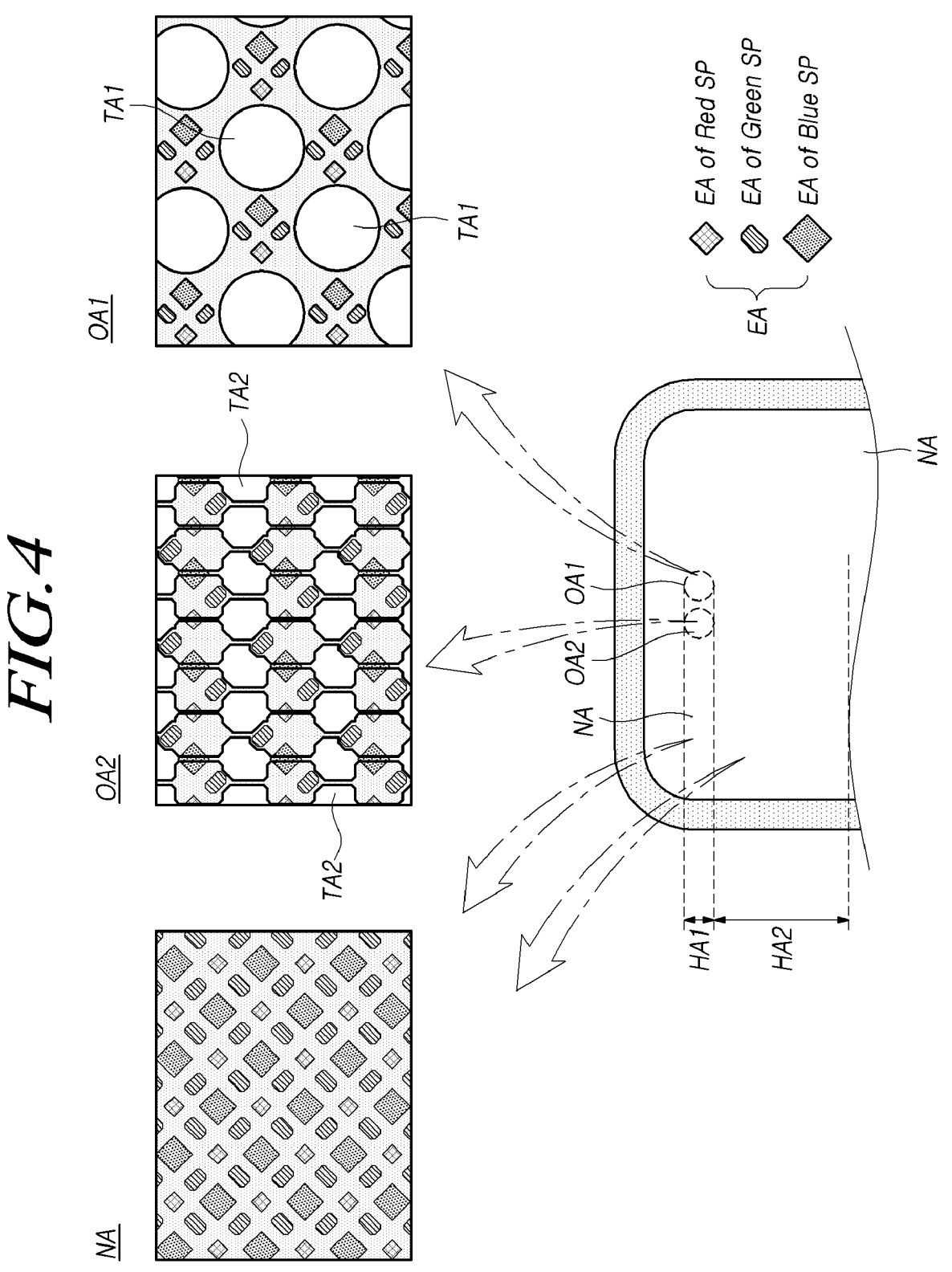
FIG. 4 is an overview illustrating arrangements of subpixels in three areas included in a display area of the display panel according to an aspect of the present disclosure.

Next, FIG. 4 is an overview illustrating different arrangements of subpixels SP in the three areas (NA, OA1, and OA2) included in the display area DA of the display panel 110 according to an aspect of the present disclosure. Referring to FIG. 4, in some embodiments, a plurality of subpixels SP can be disposed in the normal area NA, the first optical area OA1, and the second optical area OA2 included in the display area DA.

The plurality of subpixels SP can include, for example, a red subpixel (Red SP) emitting red light, a green subpixel (Green SP) emitting green light, and a blue subpixel (Blue SP) emitting blue light. Accordingly, the normal area NA, the first optical area OA1, and the second optical area OA2 can include light emitting areas EA of red subpixels (Red SP), light emitting areas EA of green subpixels (Green SP), and light emitting areas EA of blue subpixels (Blue SP).

Referring to FIG. 4, a light transmission structure can be omitted in the normal area NA, but be provided in the light emitting areas EA. On the contrary, the first optical area OA1 and the second optical area OA2 include both the light emitting areas EA and the light transmission structure. That is, the first optical area OA1 includes light emitting areas EA and first transmission areas TA1, and the second optical area OA2 includes can light emitting areas EA and second transmission areas TA2.

In addition, the light emitting areas EA and the transmission areas TA1 and/or TA2 can be distinct according to whether the transmission of light is allowed. For example, the light emitting areas EA are areas not allowing light to transmit (e.g., not allowing light to transmit to the back of the display panel), and the transmission areas (TA1 and/or TA2) can are areas allowing light to transmit (e.g., allowing light to transmit to the back of the display panel).

The light emitting areas EA and the transmission areas TA1 and TA2 can be also distinct according to whether or not a specific metal layer is included. For example, the cathode electrode CE as shown in FIG. 3 can be disposed in the light emitting areas EA, and not disposed in the transmission areas TA1 and TA2. In some embodiments, a light shield layer can also be disposed in the light emitting areas EA, and not be disposed in the transmission areas TA1 and TA2.

Because the first optical area OA1 includes the first transmission areas TA1 and the second optical area OA2 includes the second transmission areas TA2, both of the first optical area OA1 and the second optical area OA2 are areas through which light can transmit. In one embodiment, a transmittance (degree of transmission) of the first optical area OA1 and a transmittance (degree of transmission) of the second optical area OA2 can be substantially equal.

For example, the first transmission area TA1 of the first optical area OA1 and the second transmission area TA2 of the second optical area OA2 can have substantially the same shape or size. In another example, even when the first transmission area TA1 of the first optical area OA1 and the second transmission area TA2 of the second optical area OA2 have different shapes or sizes, a ratio of the first transmission area TA1 to the first optical area OA1 and a ratio of the second transmission area TA2 to the second optical area OA2 can be substantially equal. In one example, each of the first transmission areas TA1s has the same shape and size, and each of the second transmission areas TA2s has the same shape and size.

In another embodiment, a transmittance (degree of transmission) of the first optical area OA1 and a transmittance (degree of transmission) of the second optical area OA2 can be different. For example, the first transmission area TA1 of the first optical area OA1 and the second transmission area TA2 of the second optical area OA2 can have different shapes or sizes. In another example, even when the first transmission area TA1 of the first optical area OA1 and the second transmission area TA2 of the second optical area OA2 have substantially the same shape or size, a ratio of the first transmission area TA1 to the first optical area OA1 and a ratio of the second transmission area TA2 to the second optical area OA2 can be different from each other.

For example, when the first optical electronic device 11, and the second optical electronic device 12 is a sensor for detecting images, the camera can need a greater amount of light than the sensor. Thus, the transmittance (degree of transmission) of the first optical area OA1 can be greater than the transmittance (degree of transmission) of the second optical area OA2. For example, the first transmission area TA1 of the first optical area OA1 can have a size greater than the second transmission area TA2 of the second optical area OA2. In another example, even when the first transmission area TA1 of the first optical area OA1 and the second transmission area TA2 of the second optical area OA2 have substantially the same size, a ratio of the first transmission area TA1 to the first optical area OA1 can be greater than a ratio of the second transmission area TA2 to the second optical area OA2.

The following description is provided based on the embodiment in which the transmittance (degree of transmission) of the first optical area OA1 is greater than the transmittance (degree of transmission) of the second optical area OA2. Further, the transmission areas TA1 and TA2 as shown in FIG. 4 can be referred to as transparent areas, and the term transmittance can be referred to as transparency.

In addition, the following description assumes the first and second optical areas OA1 and OA2 are located in an upper edge of the display area DA of the display panel 110, and are disposed to be horizontally adjacent to each other such as being disposed in a direction in which the upper edge extends, as shown in FIG. 4, unless explicitly stated otherwise.

Referring to FIG. 4, a horizontal display area including the first and second optical areas OA1 and OA2 is referred to as a first horizontal display area HA1 and another horizontal display area not including the first and second optical areas OA1 and OA2 is referred to as a second horizontal display area HA2. As shown, the first horizontal display area HA1 can include a portion of the normal area NA, the first optical area OA1, and the second optical area OA2. The second horizontal display area HA2 can also include only another portion of the normal area NA.

Figure 5:
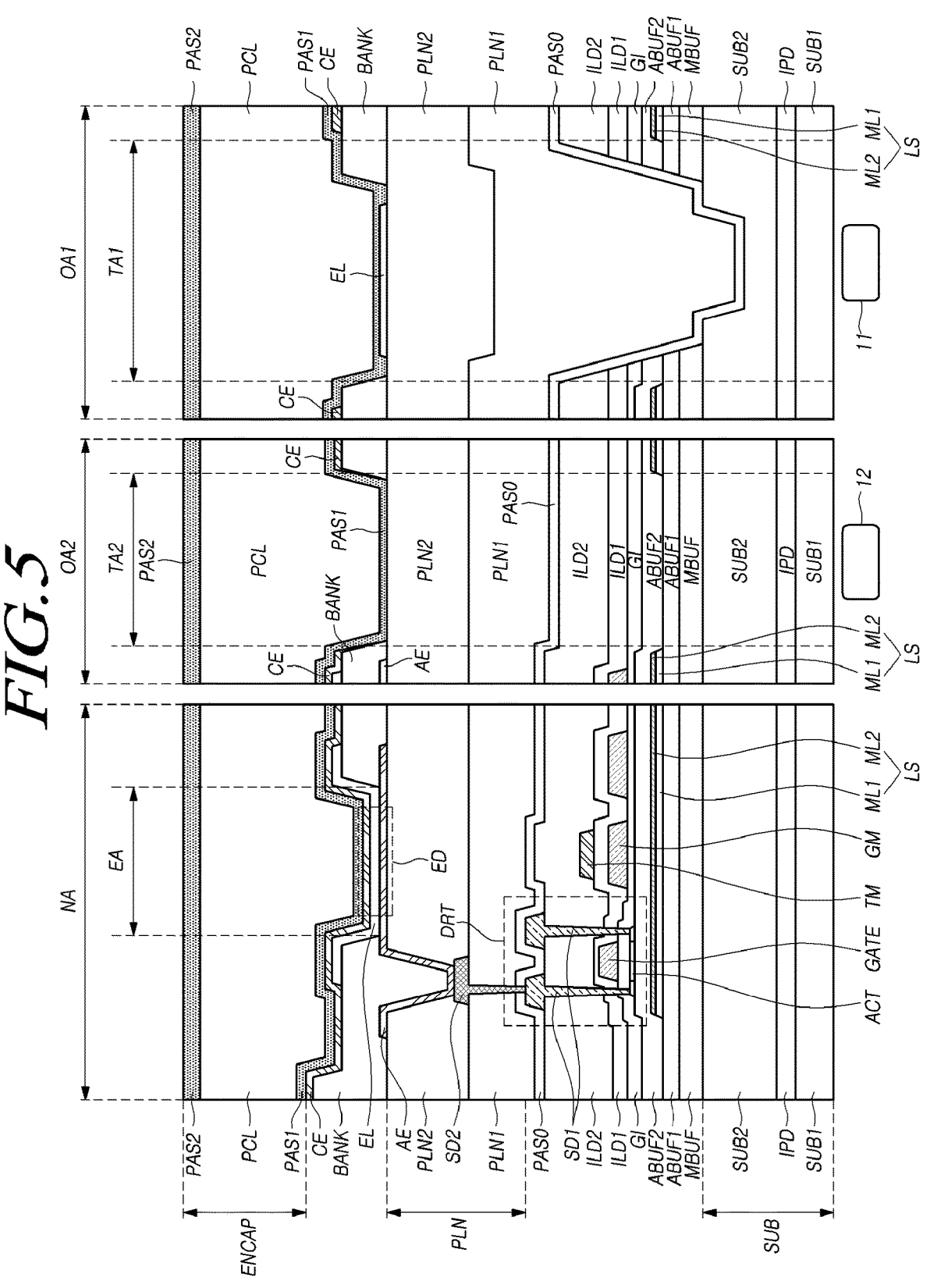
FIGS. 5 and 6 are example cross-sectional views of each of the first optical area, the second optical area, and the normal area included in the display area of the display panel according to an aspect of the present disclosure.
Figure 6:
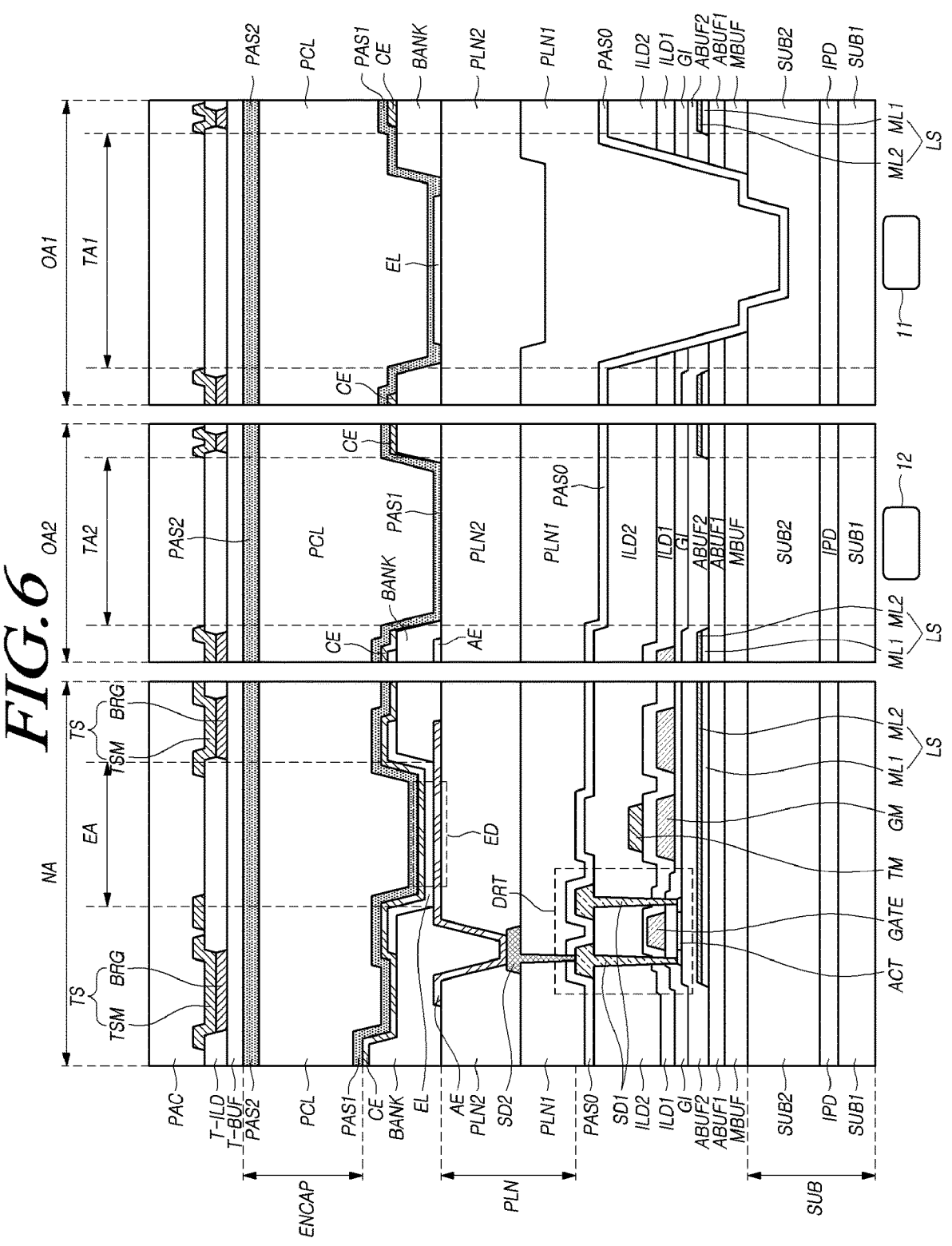

Next, FIGS. 5 and 6 are cross-sectional views of the first optical area, the second optical area, and the normal area included in the display area of the display panel according to an aspect of the present disclosure. In particular, FIG. 5 is a cross-sectional view of the display panel 110 when a touch sensor is provided outside of the display panel 110 in the form of a touch panel, and FIG. 6 is a cross-sectional view of the display panel 110 when a touch sensor TS is provided inside of the display panel 110.

First, a stack structure of the normal area NA will be described with reference to FIGS. 5 and 6. Also, respective light emitting areas EA of the first and second optical areas OA1 and OA2 can have the same stack structure as a light emitting area EA of the normal area NA.

Referring to FIGS. 5 and 6, a substrate SUB can include a first substrate SUB1, an interlayer insulating layer IPD, and a second substrate SUB2. The interlayer insulating layer IPD is interposed between the first substrate SUB1 and the second substrate SUB2. As the substrate SUB includes the first substrate SUB1, the interlayer insulating layer IPD and the second substrate SUB2, the substrate SUB can prevent or reduce the penetration of moisture. The first and second substrates SUB1 and SUB2 can be, for example, polyimide (PI) substrates. In addition, the first and second substrate SUB1 and SUB2 can be referred to as a primary PI substrate and a secondary PI substrate, respectively.

Referring to FIGS. 5 and 6, various types of patterns (ACT, SD1, GATE), for disposing transistors such as a driving transistor DRT, and the like, various types of insulating layers (MBUF, ABUF1, ABUF2, GI, ILD1, ILD2, PAS0), and various types of metal patterns (TM, GM, ML1, ML2) can be disposed on or over the substrate SUB. In addition, as shown, a multi-buffer layer MBUF is disposed on the second substrate SUB2, and a first active buffer layer ABUF1 is disposed on the multi-buffer layer MBUF. A first metal layer ML1 and a second metal layer ML2 are also disposed on the first active buffer layer ABUF1, and can be, for example, light shield layers LS for shielding light.

Also, the second active buffer layer ABUF2 is disposed on the first metal layer ML1 and the second metal layer ML2. An active layer ACT of the driving transistor DRT is also disposed on the second active buffer layer ABUF2, and a gate insulating layer GI is disposed to cover the active layer ACT.

In addition, a gate electrode GATE of the driving transistor DRT is disposed on the gate insulating layer GI. Further, a gate material layer GM is disposed on the gate insulating layer GI, together with the gate electrode GATE of the driving transistor DRT, at a location different from the location where the driving transistor DRT is disposed. A first interlayer insulating layer ILD1 is also disposed to cover the gate electrode GATE and the gate material layer GM. A metal pattern TM is disposed on the first interlayer insulating layer ILD1 and can be located at a location different from the location where the driving transistor DRT is formed. A second interlayer insulating layer ILD2 is also disposed to cover the metal pattern TM on the first interlayer insulating layer ILD1.

Further, two first source-drain electrode patterns SD1 can be disposed on the second interlayer insulating layer ILD2. One of the two first source-drain electrode patterns SD1 can be a source node of the driving transistor DRT, and the other can be a drain node of the driving transistor DRT. The two first source-drain electrode patterns SD1 can also be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping the gate electrode GATE serves as a channel region. One of the two first source-drain electrode patterns SD1 can be connected to the first side portion of the channel region of the active layer ACT, and the other of the two first source-drain electrode patterns SD1 can be connected to the second side portion of the channel region of the active layer ACT.

A passivation layer PAS0 is also disposed to cover the two first source-drain electrode patterns SD1. Further, a planarization layer PLN is disposed on the passivation layer PAS0. The planarization layer PLN can include a first planarization layer PLN1 and a second planarization layer PLN2. In particular, the first planarization layer PLN1 is disposed on the passivation layer PAS0.

A second source-drain electrode pattern SD2 is also disposed on the first planarization layer PLN1. The second source-drain electrode pattern SD2 is connected to one of the two first source-drain electrode patterns SD1 (corresponding to the second node N2 of the driving transistor DRT in the subpixel SP of FIG. 3) through a contact hole formed in the first planarization layer PLN1. Further, the second planarization layer PLN2 is disposed to cover the second source-drain electrode pattern SD2. A light emitting element ED is also disposed on the second planarization layer PLN2.

According to an example stack structure of the light emitting element ED, an anode electrode AE can be disposed on the second planarization layer PLN2. In addition, the anode electrode AE can be electrically connected to the second source-drain electrode pattern SD2 through a contact hole formed in the second planarization layer PLN2. A bank BANK is also disposed to cover a portion of the anode electrode AE, and a portion of the bank BANK corresponding to a light emitting area EA of the subpixel SP is opened.

A portion of the anode electrode AE is also exposed through the opening (the opened portion) of the bank BANK. Thus, an emission layer EL can be positioned on side surfaces of the bank BANK and in the opening (the opened portion) of the bank BANK. All or at least a portion of the emission layer EL can be located between adjacent banks.

In the opening of the bank BANK, the emission layer EL can contact the anode electrode AE. A cathode electrode CE is also disposed on the emission layer EL. Thus, the light emitting element ED can be formed by including the anode electrode AE, the emission layer EL, and the cathode electrode CE, as described above. The emission layer EL can include an organic material layer.

Further, an encapsulation layer ENCAP is disposed on the stack of the light emitting element ED. In particular, the encapsulation layer ENCAP can have a single-layer structure or a multi-layer structure. For example, as shown in FIGS. 5 and 6, the encapsulation layer ENCAP can include a first encapsulation layer PAS1, a second encapsulation layer PCL, and a third encapsulation layer PAS2.

In addition, the first encapsulation layer PAS1 and the third encapsulation layer PAS2 can be, for example, an inorganic material layer, and the second encapsulation layer PCL can be, for example, an organic material layer. Among the first encapsulation layer PAS1, the second encapsulation layer PCL, and the third encapsulation layer PAS2, the second encapsulation layer PCL can be the thickest and serve as a planarization layer.

Further, the first encapsulation layer PAS1 is disposed on the cathode electrode CE and closest to the light emitting element ED. The first encapsulation layer PAS1 can include an inorganic insulating material capable of being deposited using low-temperature deposition. For example, the first encapsulation layer PAS1 can include, but is not limited to, silicon nitride (SiNx), silicon oxide (SiOx), silicon oxynitride (SiON), aluminum oxide (Al2O3), or the like. Since the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

The second encapsulation layer PCL can also have a smaller area or size than the first encapsulation layer PAS1. For example, the second encapsulation layer PCL can be disposed to expose both ends or edges of the first encapsulation layer PAS1. The second encapsulation layer PCL can also serve as a buffer for relieving stress between corresponding layers while the display device 100 is curved or bent, and serve to enhance planarization performance. For example, the second encapsulation layer PCL can include an organic insulating material, such as acrylic resin, epoxy resin, polyimide, polyethylene, silicon oxycarbon (SiOC), or the like. The second encapsulation layer PCL can be disposed, for example, using an inkjet scheme.

In addition, the third encapsulation layer PAS2 can be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can thus minimize or prevent external moisture or oxygen from penetrating into the first encapsulation layer PAS1 and the second encapsulation layer PCL. For example, the third encapsulation layer PAS2 can include an inorganic insulating material, such as silicon nitride (SiNx), silicon oxide (SiOx), silicon oxynitride (SiON), aluminum oxide (Al2O3), or the like.

Referring to FIG. 6, when the touch sensor TS is embedded into the display panel 110, the touch sensor TS is disposed on the encapsulation layer ENCAP. The structure of the touch sensor will be described in detail as follows. A touch buffer layer T-BUF is disposed on the encapsulation layer ENCAP, and the touch sensor TS is disposed on the touch buffer layer T-BUF.

Further, the touch sensor TS can include touch sensor metals TSM and at least one bridge metal BRG, which are located in different layers. A touch interlayer insulating layer T-ILD is also disposed between the touch sensor metals TSM and the bridge metal BRG. For example, the touch sensor metals TSM can include a first touch sensor metal TSM, a second touch sensor metal TSM, and a third touch sensor metal TSM, which are disposed adjacent to one another. In an embodiment where the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM can be electrically connected to each other through the bridge metal BRG located in a different layer. The bridge metal BRG can be electrically insulated from the third touch sensor metal TSM by the touch interlayer insulating layer T-ILD.

While the touch sensor TS is disposed on the display panel 110, a chemical solution (e.g., a developer or etchant) used in the corresponding process or moisture from the outside can be generated or introduced. In some embodiments, by disposing the touch sensor TS on the touch buffer layer T-BUF, a chemical solution or moisture can be prevented from penetrating into the emission layer EL including an organic material during the manufacturing process of the touch sensor TS. Accordingly, the touch buffer layer T-BUF can prevent damage to the emission layer EL, which is vulnerable to a chemical solution or moisture.

To prevent damage to the emission layer EL including an organic material, which is vulnerable to high temperatures, the touch buffer layer T-BUF can be formed at a low temperature less than or equal to a predetermined temperature (e.g., 100 degrees (° C.)) and be formed using an organic insulating material having a low permittivity of 1 to 3. For example, the touch buffer layer T-BUF can include an acrylic-based, epoxy-based, or siloxan-based material. As the display device 100 is bent, the encapsulation layer ENCAP can be damaged, and the touch sensor metal located on the touch buffer layer T-BUF can be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS. A protective layer PAC can also be disposed to cover the touch sensor TS. The protective layer PAC can be, for example, an organic insulating layer.

Next, a stack structure of the first optical area OA1 will be described with reference to FIGS. 5 and 6. In addition, the light emitting area EA of the first optical area OA1 have the same stack structure as that in the normal area NA. Accordingly, only the stack structure of the first transmission area TA1 of the first optical area OA1 will be described.

In some embodiments, the cathode electrode CE can be disposed in the light emitting areas EA included in the normal area NA and the first optical area OA1, but not be disposed in the first transmission area TA1 in the first optical area OA1. For example, the first transmission area TA1 of the first optical area OA1 can correspond to an opening of the cathode electrode CE.

Further, a light shield layer LS including at least one of the first metal layer ML1 and the second metal layer ML2 can be disposed in the light emitting areas EA included in the normal area NA and the first optical area OA1, but not be disposed in the first transmission area TA1 of the first optical area OA1. For example, the first transmission area TA1 of the first optical area OA1 can correspond to an opening of the light shield layer LS.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the first optical area OA1 can be disposed in the first transmission area TA1 in the first optical area OA1 equally, substantially equally, or similarly.

However, in some embodiments, all, or one or more, of material layers having electrical properties (e.g., metal material layers, and/or semiconductor layers), except for the insulating materials or layers, disposed in the light emitting areas EA included in the normal area NA and the first optical area OA1 cannot be disposed in the first transmission area TA1 in the first optical area OA1. For example, referring to FIGS. 5 and 6, all, or one or more, of the metal material layers (ML1, ML2, GATE, GM, TM, SD1, SD2) related to at least one transistor and the semiconductor layer ACT cannot be disposed in the first transmission area TA1.

Referring to FIGS. 5 and 6, the anode electrode AE and the cathode electrode CE included in the light emitting element ED are not disposed in the first transmission area TA1. Further, the emission layer EL of the light emitting element ED may or may not be disposed in the first transmission area TA1 according to a design requirement. In some embodiments, referring to FIG. 6, the touch sensor metal TSM and the bridge metal BRG included in the touch sensor TS may not be disposed in the first transmission area TA1 of the first optical area OA1.

Accordingly, the light transmittance of the first transmission area TA1 in the first optical area OA1 can be provided or improved because the material layers (e.g., metal material layers, and/or semiconductor layers) having electrical properties are not disposed in the first transmission area TA1 in the first optical area OA1. Thus, the first optical electronic device 11 can perform a predefined function (e.g., image sensing) by receiving light transmitting through the first transmission area TA1.

In addition, it is preferably to further increase a transmittance of the first transmission area TA1 in the first optical area OA1, because all or part of the first transmission area TA1 overlaps the first optical electronic device 11. The present disclosure provides a transmittance improvement structure TIS to the first transmission area TA1 of the first optical area OA1.

Referring to FIGS. 5 and 6, the plurality of insulating layers included in the display panel 110 can include at least one buffer layer (MBUF, ABUF1, and/or ABUF2) between at least one substrate (SUB1, and/or SUB2) and at least one transistor (DRT, and/or SCT), at least one planarization layers (PLN1, and/or PLN2) between the transistor DRT and the light emitting element ED, at least one encapsulation layer ENCAP on the light emitting element ED, and the like.

Referring to FIG. 6, the plurality of insulating layers included in the display panel 110 can further include the touch buffer layer T-BUF and the touch interlayer insulating layer T-ILD located on the encapsulation layer ENCAP, and the like. Referring to FIGS. 5 and 6, the first transmission area TA1 of the first optical area OA1 can have a structure in which the first planarization layer PLN1 and the passivation layer PAS0 have depressed portions that extend downward from respective surfaces thereof as a transmittance improvement structure TIS. As shown, among the plurality of insulating layers, the first planarization layer PLN1 can include at least one depression (e.g., a recess, a trench, a concave portion, a protrusion, or the like). The first planarization layer PLN1 can be, for example, an organic insulating layer.

When the first planarization layer PLN1 has the depressed portion that extends downward from the surfaces thereof, the second planarization layer PLN2 can substantially serve to provide planarization. In one embodiment, the second planarization layer PLN2 can also have a depressed portion that extends downward from the surface thereof. In this embodiment, the second encapsulation layer PCL can substantially serve to provide planarization.

Referring to FIGS. 5 and 6, the depressed portions of the first planarization layer PLN1 and the passivation layer PAS0 can pass through insulating layers, such as the first interlayer insulating layer ILD, the second interlayer insulating layer ILD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2.

Referring to FIGS. 5 and 6, the substrate SUB can include at least one concave portion or depressed portion as a transmittance improvement structure TIS. For example, in the first transmission area TA1, an upper portion of the second substrate SUB2 can be indented or depressed downward, or the second substrate SUB2 can be perforated. As shown, the first encapsulation layer PAS1 and the second encapsulation layer PCL included in the encapsulation layer ENCAP can also have a transmittance improvement structure TIS in which the first encapsulation layer PAS1 and the second encapsulation layer PCL have depressed portions that extend downward from the respective surfaces thereof. The second encapsulation layer PCL can be, for example, an organic insulating layer.

Referring to FIG. 6, to protect the touch sensor TS, the protective layer PAC can be disposed to cover the touch sensor TS on the encapsulation layer ENCAP. As shown, the protective layer PAC can have at least one depression (e.g., a recess, a trench, a concave portion, a protrusion, or the like) as a transmittance improvement structure TIS in a portion overlapping the first transmission area TA1. The protective layer PAC can be, for example, an organic insulating layer.

Still referring to FIG. 6, the touch sensor TS can include touch sensor metals TSM with a mesh type. When the touch sensor metal TSM is formed in the mesh type, a plurality of openings are formed in the touch sensor metal TSM. Each opening can be located to correspond to the light emitting area EA of the subpixel SP.

For the first optical area OA1 to have a transmittance greater than the normal area NA, an area or size of the touch sensor metal TSM per unit area in the first optical area OA1 can be smaller than an area or size of the touch sensor metal TSM per unit area in the normal area NA. Referring to FIG. 6, the touch sensor TS can be disposed in the light emitting area EA of the first optical area OA1, and not be disposed in the first transmission area TA1 of the first optical area OA1.

Next, a stack structure of the second optical area OA2 will be described with reference to FIGS. 5 and 6. As shown in FIGS. 5 and 6, the light emitting area EA of the second optical area OA2 can have the same stack structure as that of the normal area NA. Accordingly, the stack structure of the second transmission area TA2 in the second optical area OA2 will be described.

As shown, the cathode electrode CE can be disposed in the light emitting areas EA included in the normal area NA and the second optical area OA2, and not be disposed in the second transmission area TA2 in the second optical area OA2. For example, the second transmission area TA2 in the second optical area OA2 can be corresponded to an opening of the cathode electrode CE.

In addition, the light shield layer LS including at least one of the first metal layer ML1 and the second metal layer ML2 can be disposed in the light emitting areas EA included in the normal area NA and the second optical area OA2, and not be disposed in the second transmission area TA2 in the second optical area OA2. For example, the second transmission area TA2 in the second optical area OA2 can be corresponded to an opening of the light shield layer LS. When the transmittance of the second optical area OA2 and the transmittance of the first optical area OA1 are the same, the stack structure of the second transmission area TA2 in the second optical area OA2 can be the same as the stacked structure of the first transmission area TA1 in the first optical area OA1.

In another example where the transmittance of the second optical area OA2 and the transmittance of the first optical area OA1 are different, the stack structure of the second transmission area TA2 in the second optical area OA2 can be different at least in part from as the stacked structure of the first transmission area TA1 in the first optical area OA1. For example, as shown in FIGS. 5 and 6, when the transmittance of the second optical area OA2 is lower than the transmittance of the first optical area OA1, the second transmission area TA2 in the second optical area OA2 does not have a transmittance improvement structure TIS. Thus, the first planarization layer PLN1 and the passivation layer PAS0 cannot be indented or depressed. Further, a width of the second transmission area TA2 in the second optical area OA2 can be smaller than a width of the first transmission area TA1 in the first optical area OA1.

In addition, the substrate SUB and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the second optical area OA2 can be disposed in the second transmission area TA2 of the second optical area OA2 equally, substantially equally, or similarly. However, material layers having electrical properties (e.g., metal material layers, and/or optical area semiconductor layers), except for the insulating materials or layers, disposed in the light emitting areas EA included in the normal area NA and the second optical area OA2 can be omitted in the second transmission area TA2 in the second optical area OA2.

For example, referring to FIGS. 5 and 6, all, or one or more, of the metal material layers (ML1, ML2, GATE, GM, TM, SD1, SD2) related to at least one transistor and the semiconductor layer ACT can be omitted in the second transmission area TA2 of the second optical area OA2. Further, the anode electrode AE and the cathode electrode CE included in the light emitting element ED can be omitted in the second transmission area TA2 of the second optical area OA2. Also, the emission layer EL of the light emitting element ED can be disposed or can be omitted in the second transmission area TA2 of the second optical area OA2.

Referring to FIG. 6, the touch sensor metal TSM and the bridge metal BRG included in the touch sensor TS are not disposed in the second transmission area TA2 of the second optical area OA2. Accordingly, the light transmittance of the second transmission area TA2 in the second optical area OA2 can be provided or improved because the material layers (e.g., one or more metal material layers, and/or one or more semiconductor layers) having electrical properties are not disposed in the second transmission area TA2 in the second optical area OA2. As a consequence, the second optical electronic device 12 can perform a predefined function (e.g., detecting an object or human body, or an external illumination detection) by receiving light transmitting through the second transmission area TA2.

Figure 7:
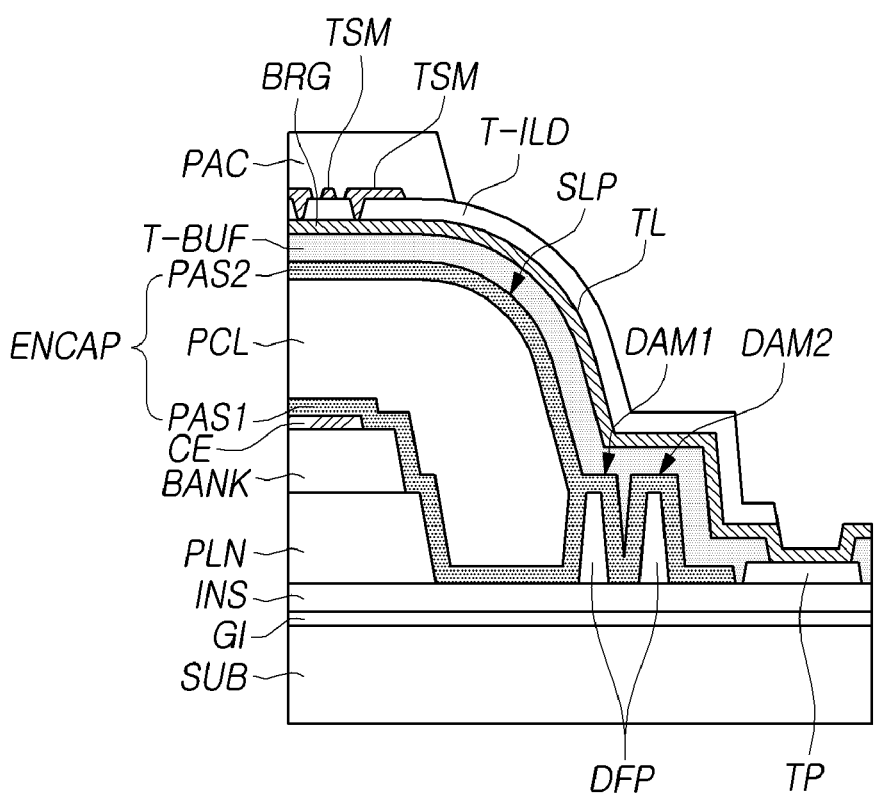
FIG. 7 is an cross-sectional view of an edge of the display panel according to an aspect of the present disclosure.

Next, FIG. 7 is a cross-sectional view of an edge of the display panel 110 according to an aspect of the present disclosure. In addition, in FIG. 7, a single substrate SUB including the first substrate SUB1 and the second substrate SUB2 is illustrated, and layers or portions located under the bank BANK are illustrated in a simplified manner. In the same manner, FIG. 7 illustrates a single planarization layer PLN including the first planarization layer PLN1 and the second planarization layer PLN2, and a single interlayer insulating layer INS including the second interlayer insulating layer ILD2 and the first interlayer insulating layer ILD1 located under the planarization layer PLN.

Referring to FIG. 7, the first encapsulation layer PAS1 is disposed on the cathode electrode CE and disposed closest to the light emitting element ED. The second encapsulation layer PCL can also have a smaller area or size than the first encapsulation layer PAS1. For example, the second encapsulation layer PCL can be disposed to expose both ends or edges of the first encapsulation layer PAS1.

The third encapsulation layer PAS2 is disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can thus minimize or prevent external moisture or oxygen from penetrating into the first encapsulation layer PAS1 and the second encapsulation layer PCL.

Referring to FIG. 7, to prevent the encapsulation layer ENCAP from collapsing, the display panel 110 can include dams (DAM1, and/or DAM2) at, or near to, an end or edge of an inclined surface SLP of the encapsulation layer ENCAP. The dams (DAM1 and/or DAM2) can be provided at, or near to, a boundary point between the display area DA and the non-display area NDA. The dams (DAM1 and/or DAM2) can include the same material DFP as the bank BANK.

Referring to FIG. 7, the second encapsulation layer PCL including an organic material can be located only on an inner side of a first dam DAM1, which is located closest to the inclined surface SLP of the encapsulation layer ENCAP among the dams. For example, the second encapsulation layer PCL cannot be located on all of the dams (DAM1 and DAM2). In another embodiment, the second encapsulation layer PCL including an organic material can be located on at least the first dam DAM1 of the first dam DAM1 and a second dam DAM2.

For example, the second encapsulation layer PCL can extend only up to all, or at least a portion, of an upper portion of the first dam DAM1. In further another embodiment, the second encapsulation layer PCL can extend past the upper portion of the first dam DAM1 and extend up to all, or at least a portion of, an upper portion of the secondary dam DAM2.

Referring to FIG. 7, a touch pad TP electrically connected to the touch driving circuit 260, as shown in FIG. 2, is disposed on a portion of the substrate SUB outside of the dams (DAM1, and/or DAM2). A touch line TL can electrically connect, to the touch pad TP, the touch sensor metal TSM or the bridge metal BRG included in, or serving as, a touch electrode disposed in the display area DA.

One end or edge of the touch line TL can be electrically connected to the touch sensor metal TSM or the bridge metal BRG, and the other end or edge of the touch line TL can be electrically connected to the touch pad TP. Further, the touch line TL can run downward along the inclined surface SLP of the encapsulation layer ENCAP, run along the respective upper portions of the dams (DAM1 and/or DAM2), and extend up to the touch pad TP disposed outside of the dams (DAM1 and/or DAM2). Referring to FIG. 7, in one embodiment, the touch line TL can be the bridge metal BRG. In another embodiment, the touch line TL can be the touch sensor metal TSM.

Figure 8:
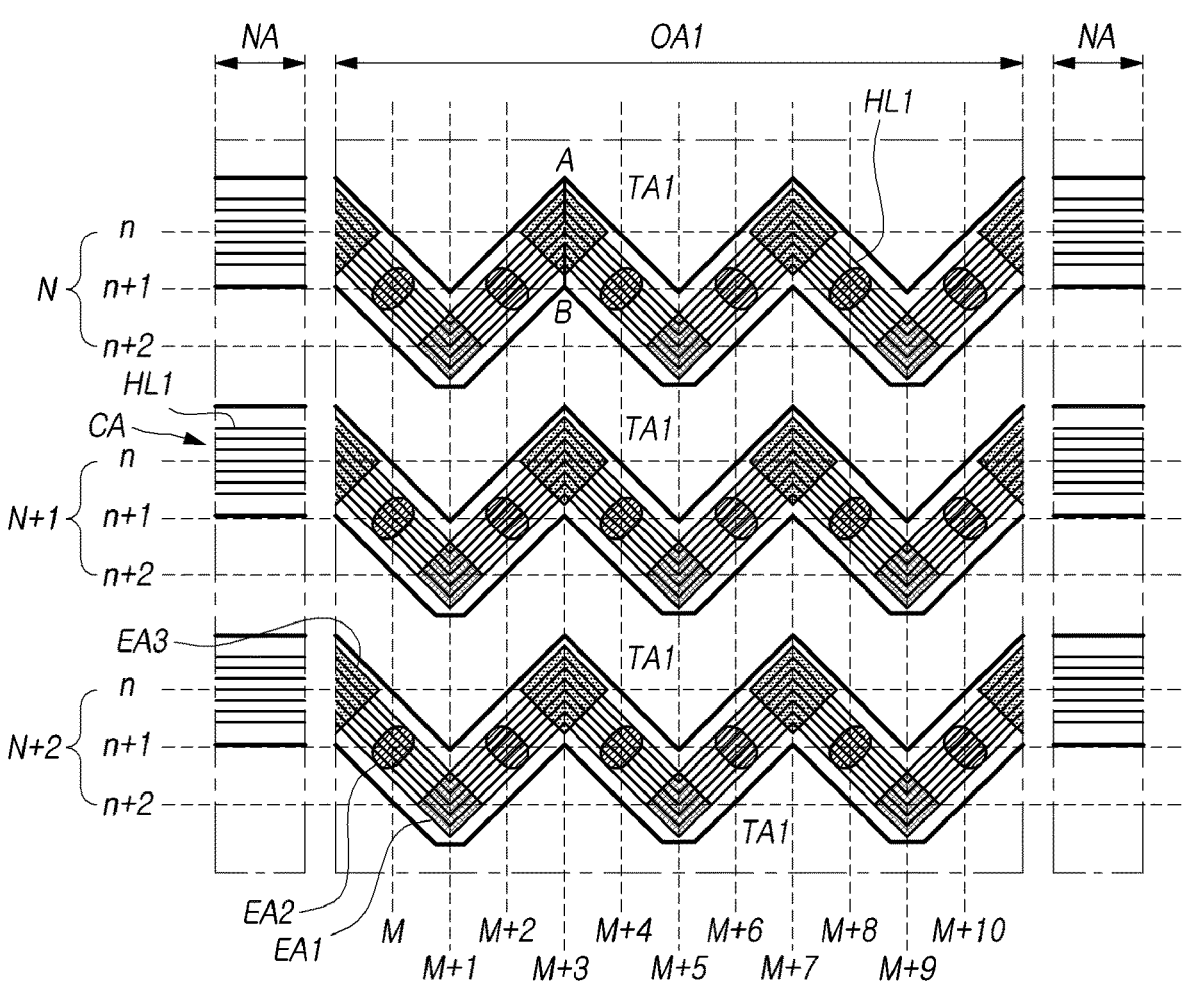
FIG. 8 is a plan view of an portion of an optical area of the display panel according to an aspect of the present disclosure.

Next, FIG. 8 is a plan view of a portion of an optical area of the display panel 110 according to an aspect of the present disclosure. Referring to FIG. 8, the display panel 110 can include a first optical area OA1. The optical area OA1 of FIG. 8 can be the structure in the first optical area OA1 of the display panel 110 in the figures discussed above. However, the structure of FIG. 8 can also be applied to the second optical area OA2 of the display panel 110.

As shown in FIG. 8, the first optical area OA1 can include a plurality of light emitting areas (EA1, EA2, and EA3), circuit areas CA, and first transmission areas TA1. In an embodiment, the light emitting areas (EA1, EA2, and EA3) and the circuit areas CA can at least partially overlap each other.

In addition, the circuit areas CA can also overlap a non-light-emitting area NEA surrounding the light emitting areas (EA1, EA2, and EA3). A plurality of signal lines can also be disposed in the circuit areas CA of the first optical area OA1. Among the plurality of signal lines, various types of horizontal lines HL1 and various types of vertical lines can be disposed in the display panel 110.

In addition, the term "horizontal" and the term "vertical" are used to refer to two directions intersecting the display panel; however, the horizontal direction and the vertical direction can be changed depending on a viewing direction. The horizontal direction can refer to, for example, a direction in which one gate line GL extends and, and the vertical direction can refer to, for example, a direction in which one data line DL extends. As such, the terms horizontal and vertical are used to represent two directions.

Further, a plurality of first horizontal lines HL1 can include any one of either a metal such as aluminum (Al), gold (Au), silver (Ag), copper (Cu), tungsten (W), molybdenum (Mo), chromium (Cr), tantalum (Ta), titanium (Ti), and the like, or an alloy of two or more of these metals; however, embodiments of the present disclosure are not limited thereto. In addition, the plurality of first horizontal lines HL1 can run through a second optical area (e.g., the second optical area OA2 in the figures discussed above), as well as the first optical area OA1.

For example, the number of subpixels SP connected to each, or one or more, of first horizontal lines HL1 running through the first and second optical areas OA1 and OA2 can be different from the number of subpixels SP connected to each, or one or more, of second horizontal lines disposed only in the normal area NA without running through the first and second optical areas OA1 and OA2. In addition, the number (which can be referred to as a first number) of subpixels SP connected to each, or one or more, of the first horizontal lines HL1 running through the first and second optical areas OA1 and OA2 can be smaller than the number (which can be referred to as a second number) of subpixels SP connected to each, or one or more, of the second horizontal lines disposed only in the normal area NA without running through the first and second optical areas OA1 and OA2.

A difference between the first number and the second number can vary according to a difference between a resolution of each of the first optical area OA1 and the second optical area OA2 and a resolution of the normal area NA. For example, as a difference between a resolution of each of the first optical area OA1 and the second optical area OA2 and a resolution of the normal area NA increases, a difference between the first number and the second number can increase.

As described above, because the number (the first number) of subpixels connected to each, or one or more, of the first horizontal lines HL1 running through the first and second optical areas OA1 and OA2 is smaller than the number of subpixels (the second number) connected to each, or one or more, of the second horizontal lines disposed only in the normal area NA without running through the first and second optical areas OA1 and OA2, an area where each, or one or more, of the first horizontal lines HL1 overlap adjacent electrodes or lines can be smaller than an area where each, or one or more, of the second horizontal lines overlap adjacent electrodes or lines.

Accordingly, parasitic capacitances (which can be referred to as a first capacitance) formed between each, or one or more, of the first horizontal lines HL1 and adjacent electrodes or lines can be much smaller than parasitic capacitances (which can be referred to as a second capacitance) formed between each, or one or more, of the second horizontal lines and adjacent electrodes or lines.

Considering a relationship in magnitude between resistances (which can be referred to as a first resistance) of each, or one or more, of the first horizontal lines HL1 running through the first and second optical areas OA1 and OA2 and resistances (which can be referred to as a second resistance) of each, or one or more, of the second horizontal lines disposed only in the normal area NA without running through the first and second optical areas OA1 and OA2 (i.e., the first resistance≥the second resistance), and a relationship in magnitude between the first capacitance and the second capacitance (i.e., the first capacitance<<second capacitance), resistance-capacitance (RC) values (which can be referred to as a first RC value) of each, or one or more, of the first horizontal lines HL1 running through the first and second optical areas OA1 and OA2 can be much smaller than RC values (which can be referred to as a second RC value) of each, or one or more, of the second horizontal lines disposed only in the normal area NA without running through the first and second optical areas OA1 and OA2 (i.e., the first RC value<<the second RC value).

Due to a difference (which can be referred to as an RC load difference) between the first RC value of each, or one or more, of the first horizontal lines HL1 and the second RC value of each, or one or more, of the second horizontal lines, signal transmission characteristics through the first horizontal lines HL1 can be different from signal transmission characteristics through the second horizontal lines.

As illustrated in FIG. 8, each of the first horizontal lines HL1 can be integrally formed with a second horizontal line disposed in the normal area NA. The first horizontal lines HL1 can also overlap the light emitting areas (EA1, EA2, and EA3) disposed in the first optical area OA1. The light emitting areas (EA1, EA2, and EA3) disposed in the first optical area OA1 can be disposed in a plurality of rows and a plurality of columns.

As shown in FIG. 8, first light emitting areas EA1, second light emitting areas EA2, and third light emitting areas EA3 can be disposed in the plurality of rows (N, N+1, N+2, . . . ). Each of the first to third light emitting areas (EA1, EA2, and EA3) can emit light of a color different from one another. For example, the first light emitting area EA1 can be an area for emitting red (R) light, the second light emitting area EA2 can be an area for emitting green (G) light, and the third light emitting area EA3 can be an area for emitting blue (B) light. However, embodiments of the present specification are not limited thereto.

Each light emitting area (EA1, EA2, and EA3) can also be spaced apart from one another. For example, first light emitting areas EA1, second light emitting areas EA2, and third light emitting areas EA3 can be alternately disposed in each of the plurality of rows (N, N+1, N+2, . . . , where N is an integer greater than or equal to 1).

Referring to FIG. 8, the rows (N, N+1, N+2, . . . ) in which the light emitting areas of the first optical area OA1 are disposed have a zigzag shape. As such, the rows (N, N+1, N+2, . . . ) where the plurality of light emitting areas (EA1, EA2, and EA3) are disposed in the first optical area OA1 have a zigzag shape, and thereby, each of the rows (N, N+1, N+2, . . . ) can include one or more bent vertexes bent at an acute angle.

In addition, the first light emitting areas EA1 and third light emitting areas EA3 can be alternately disposed at bent vertexes of the rows (N, N+1, N+2, . . . ) where the plurality of light emitting areas (EA1, EA2, and EA3) are disposed. Further, the second light emitting areas EA2 can be disposed between the first light emitting areas EA1 and the third light emitting areas EA3. For example, referring to FIG. 8, one of the rows where the plurality of light emitting areas (EA1, EA2, and EA3) are disposed can include a first sub-row (n), a second sub-row (n+1), and a third sub-row (n+2).

The first sub-row (n) and the third sub-row (n+2) can correspond to bent vertexes of one of the rows where the plurality of light emitting areas (EA1, EA2, and EA3) are disposed. Third light emitting areas EA3 can be spaced apart from each other in the first sub-row (n), and second light emitting areas EA2 can be spaced apart from each other in the second sub-row (n+1), and first light emitting areas EA1 can be spaced apart from each other in the third sub-row (n+2).

However, the arrangement of the first to third light emitting areas (EA1, EA2, and EA3) according to embodiments of the present disclosure is not limited to the structure of FIG. 8. For example, the second light emitting areas EA2 can be spaced apart from each other in the first sub-row (n) and the third sub-row (n+2), and the first light emitting area EA1 and the third light emitting areas EA3 can be alternately disposed in the second sub-row (n+1). A first transmission areas TA1 can be disposed between the rows (N, N+1, N+2, . . . ) where the plurality of light emitting areas (EA1, EA2, and EA3) are disposed in the first optical area OA1.

Referring to FIG. 8, light emitting areas emitting the same color can be disposed in each column (M, M+1, M+2, . . . ). For example, a plurality of first light emitting areas EA1 can be spaced apart from each other in column M, a plurality of second light emitting areas EA2 can be spaced apart from each other in column M+1, and a plurality of third light emitting areas EA3 can be spaced apart from each other in column M+2.

Referring to FIG. 8, the first transmission area OA1 can be disposed between the same or different light emitting areas (EA1, EA2, and/or EA3) in each of the columns (M, M+1, M+2, . . . ) where the plurality of light emitting areas (EA1, EA2, and EA3) are disposed. Each first horizontal lines HL1 disposed in the circuit area CA of the first optical area OA1 can have a zigzag shape corresponding to a shape of a corresponding row of the rows (N, N+1, N+2, . . . ) where the plurality of light emitting areas (EA1, EA2, and EA3) are disposed. Accordingly, the plurality of first to third light emitting areas (EA1, EA2, and EA3) and the plurality of first horizontal lines HL1 can overlap each other.

As shown in FIG. 8, the first horizontal lines HL1 having a zigzag shape in the first optical area OA1 extend up to the normal area NA. The first optical area OA1 and the normal area NA can have different shapes. As shown in FIG. 8, the first horizontal lines HL1 can include a portion having a linear line shape extending in the horizontal direction in the normal area NA; however, the shape of the first horizontal lines HL1 according to embodiments of the present disclosure is not limited thereto.

As described above, in the first optical area OA1, the first horizontal lines HL1 are disposed to overlap the circuit area CA in which transistors and a storage capacitor for driving the plurality of light emitting areas (EA1, EA2, and EA3) are disposed, as well as the light emitting areas (EA1, EA2, and EA3), the transmittance of the first transmission area TA1 of the first optical area OA1 is improved. Thus, because an area in which the plurality of first horizontal lines HL1 do not overlap the first transmission area TA1 in the first optical area OA1 can be increased, the transmittance of the first transmission area TA1 can be improved.

Figure 9:
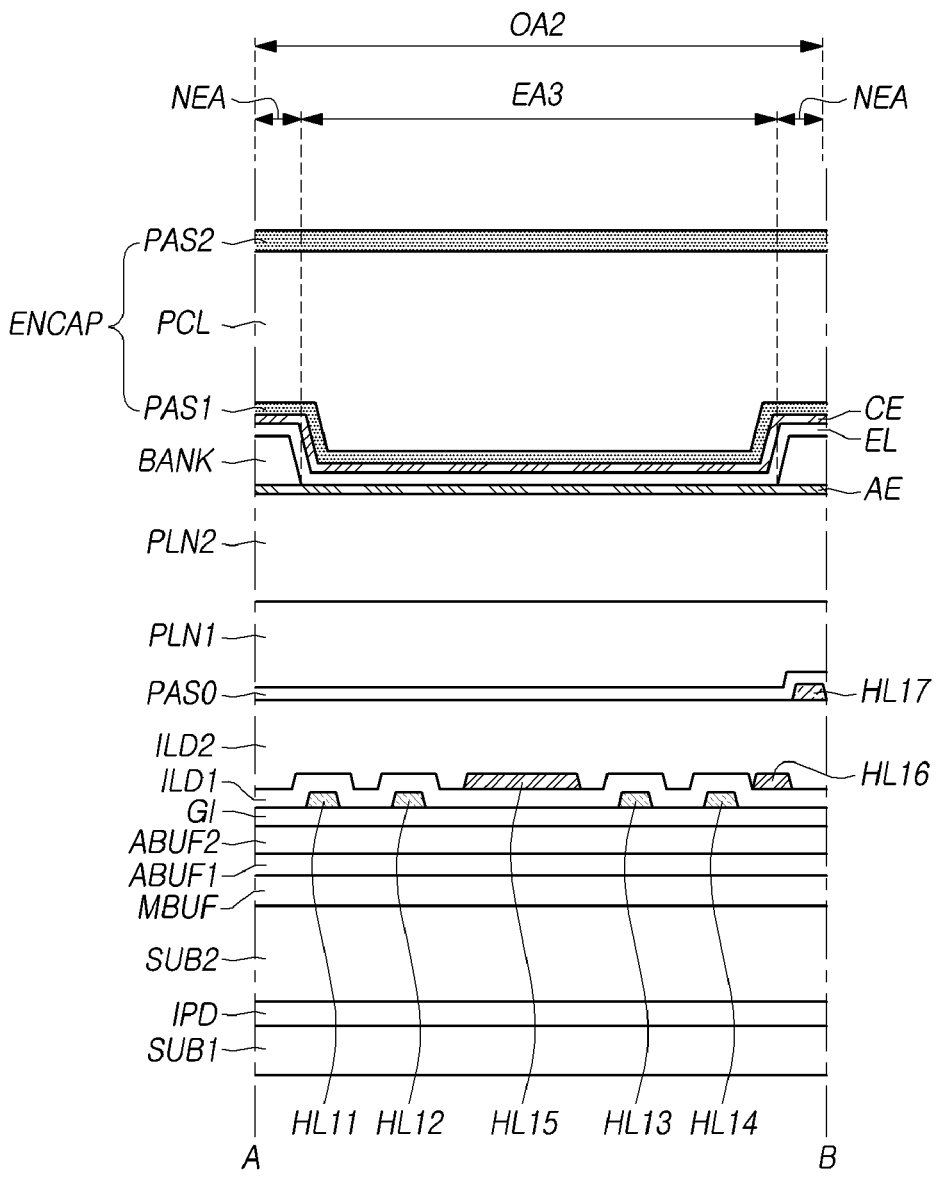
FIG. 9 is a cross-sectional view taken along line A-B of FIG. 8.

The foregoing configuration is discussed in detail with reference to FIG. 9. In particular, FIG. 9 is a cross-sectional view taken along line A-B of FIG. 8. As shown in FIG. 9, the first optical area OA1 of the display panel 110 includes a light emitting area EA and a circuit area CA overlapping the light emitting area EA. A third light emitting area EA3 also overlaps a plurality of first horizontal lines (HL11, HL12, HL13, HL14, HL15, HL16, and HL17). For example, a multi-buffer layer MBUF can be disposed on a substrate SUB, and a first active buffer layer ABUF1 can be disposed on the multi-buffer layer MBUF.

A second active buffer layer ABUF2 and a gate insulating layer GI can be sequentially disposed on the first active buffer layer ABUF1. Further, a plurality of first horizontal lines (HL11, HL12, HL13, and HL14) can be spaced apart from each other on the gate insulating layer GI.

Also, a first interlayer insulating layer ILD1 is disposed on the gate insulating layer GI on which the plurality of first horizontal lines (HL11, HL12, HL13, and HL14) are disposed. In addition, first horizontal lines (HL15 and/or HL16) are disposed on the first interlayer insulating layer ILD1. A second interlayer insulating layer ILD2 is also disposed on the first interlayer insulating layer ILD1 on which the first horizontal lines (HL15 and/or HL16) are disposed.

Further, at least one first horizontal lines HL17 can be disposed on the second interlayer insulating layer ILD2. A passivation layer PAS0, a first planarization layer PLN1, and a second planarization layer PLN2 are also sequentially disposed on the second interlayer insulating layer ILD2 on which the at least one first horizontal line HL17 is disposed. As shown, the anode electrode AE of an organic light emitting element ED such as an organic light emitting diode (OLED) is disposed on the second planarization layer PNL2.

A bank BANK for covering a portion of the anode electrode AE of the organic light emitting element ED is also disposed on the second planarization layer PNL2. An area corresponding to the third light emitting area EA3 can be an area in which the bank BANK does not overlap the anode electrode AE of the organic light emitting element ED. In addition, a portion of the anode electrode AE can be exposed through an opening (the opened portion) of the bank BANK. An emission layer EL can thus be disposed on side surfaces of the bank BANK and in the opening (the opened portion) of the bank BANK. All or at least a portion of the emission layer EL can be located between adjacent banks.

In the opening of the bank BANK, the emission layer EL can contact the anode electrode AE. A cathode electrode CE can also be disposed on the emission layer EL. Further, the light emitting element ED can be formed by including the anode electrode AE, the emission layer EL, and the cathode electrode CE, as described above. An encapsulation layer ENCAP can also be disposed on the light emitting element ED. Light emitted from the light emitting element ED can also travel toward the encapsulation layer ENCAP.

As illustrated in FIG. 9, the third light emitting area EA3 overlaps the first horizontal lines HL1. For example, the third light emitting area EA3 can overlap all, or one or more, of the plurality of first horizontal lines (HL11, HL12, HL13, HL14, HL15, HL16, and HL17) overlapping one of the rows (N, N+1, N+2, . . . ) where the plurality of light emitting areas (EA1, EA2, and EA3) are disposed.

In addition, a first horizontal line HL1 (e.g., HL17) that does not overlap the third light emitting area EA3 can overlap a non-light-emitting area NEA surrounding the third emission area EA3. The first horizontal line (e.g., HL17) disposed in the non-light-emitting area NEA in the first optical area OA1 can include an area not overlapping the first transmission area TA1 while overlapping the bank BANK.

Figure 10:
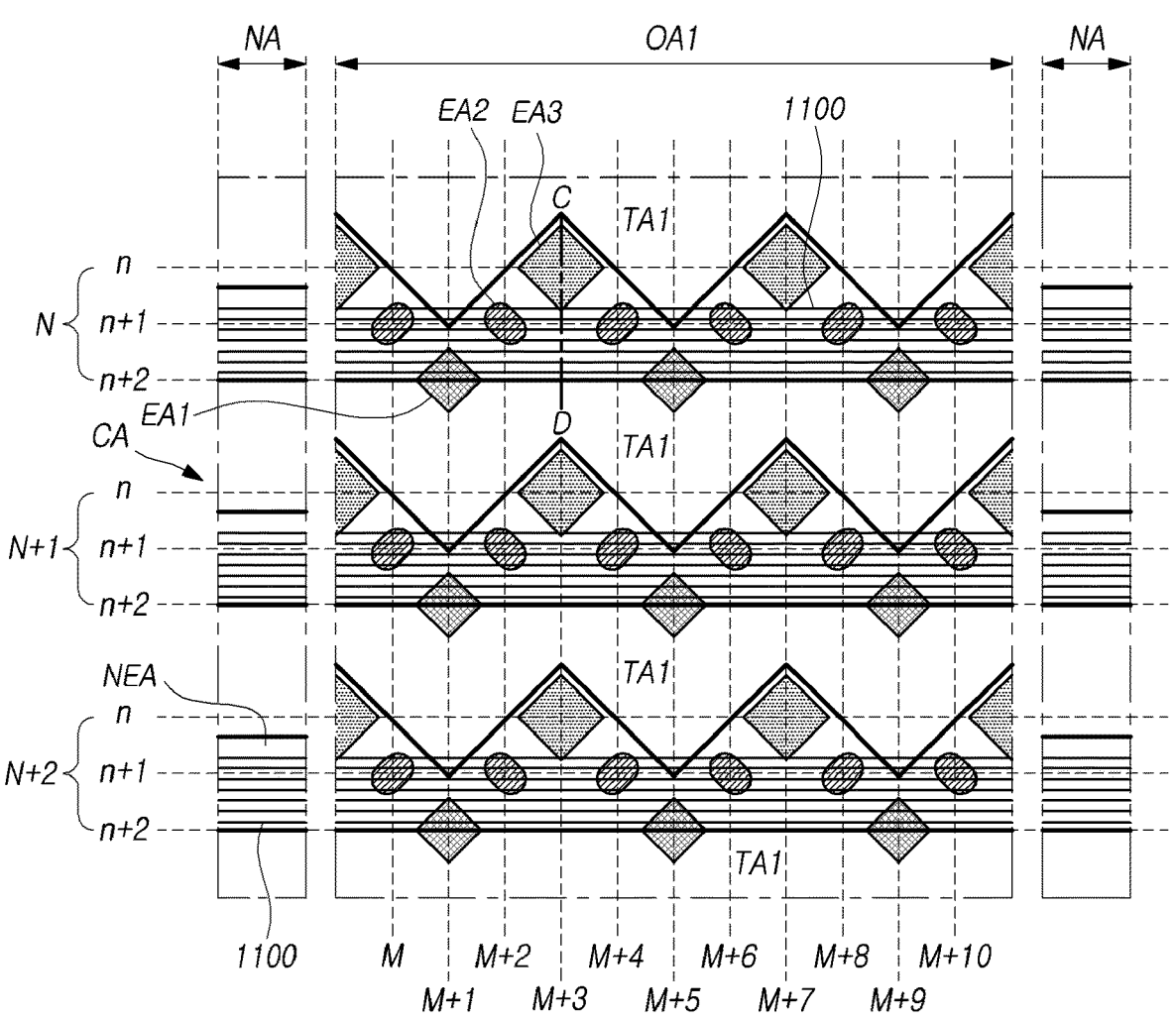
FIGS. 10 and 11 are structural views illustrating an optical area of a display panel according to a comparative example.
Figure 11:
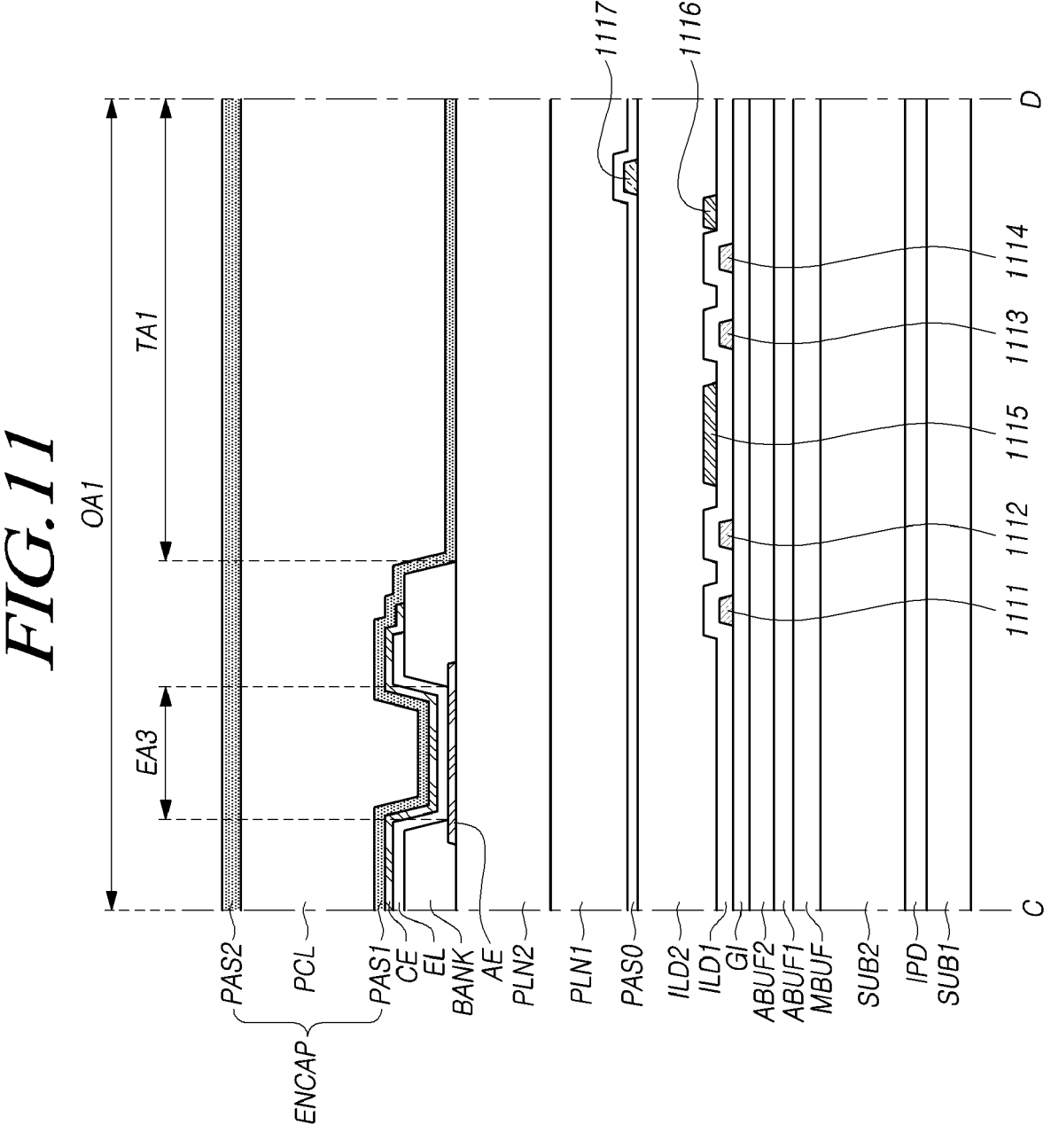

Next, FIGS. 10 and 11 are overviews illustrating a structure of an optical area of a display panel according to a comparative example. The structures of FIGS. 10 and 11 can be the same as the structures of FIGS. 8 and 9 except for a configuration in which a plurality of first horizontal lines 1100 extend only in one direction (e.g., the horizontal direction) other than having a zigzag shape as in FIGS. 8 and 9.

Referring to FIG. 10, when the first horizontal lines 1100 extend only in one direction, the first horizontal lines 1100 can overlap a first transmission area TA1, as well as first and second light emitting areas EA1 and EA2 of the first optical area OA1 and a non-light-emitting area NEA surrounding the first and second light emitting areas EA1 and EA2 areas. For example, as shown in FIG. 10, the first horizontal lines 1100 can overlap a portion of a first transmission area TA1 located over the first light emitting area EA1 and a portion of the first transmission area TA1 located under the third light emitting area EA3 in a plan view.

Referring to FIG. 11, as two or more of the first horizontal lines (1111, 1112, 1113, 1114, 1115, 1116, and 1117) overlap the first transmission area TA1, the transmittance of the first transmission area TA1 is reduced. In contrast, as illustrated in FIGS. 8 and 9, in the display panel 110 according to embodiments of the present disclosure, a reduction in transmittance of the first transmission area TA1 due to a plurality of first horizontal lines HL1 in the first optical area OA1 can be prevented because the first horizontal lines HL1 are disposed in a zigzag shape and thus overlap a plurality of light emitting areas (EA1, EA2, and EA3) and the circuit area CA.

To improve the transmittance of the first transmission area TA1 of the first optical area OA1, arrangements of vertical lines and the light emitting areas disposed in the first optical area OA1 will be described as follows. In particular, FIGS. 12A, 12B, and 12C schematically illustrate structures of a normal area (e.g., the normal area NA in the figures discussed above), a first optical area (e.g., the first optical area OA1 in the figures discussed above), and a second optical area (e.g., the second optical area OA2 in the figures discussed above) in the display panel 110 according to an aspect of the present disclosure.

Figure 12A:
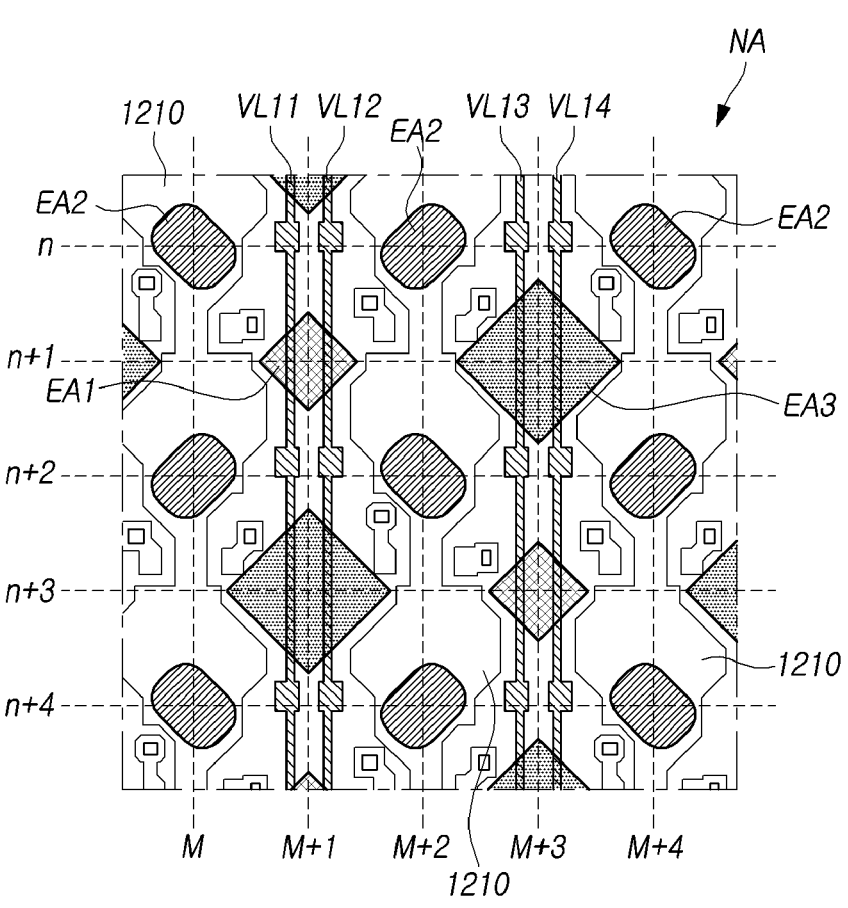
FIGS. 12A, 12B and 12C schematically illustrate structures of the normal area, the first optical area, and the second optical area in the display panel according to an aspect of the present disclosure.
Figure 12B:
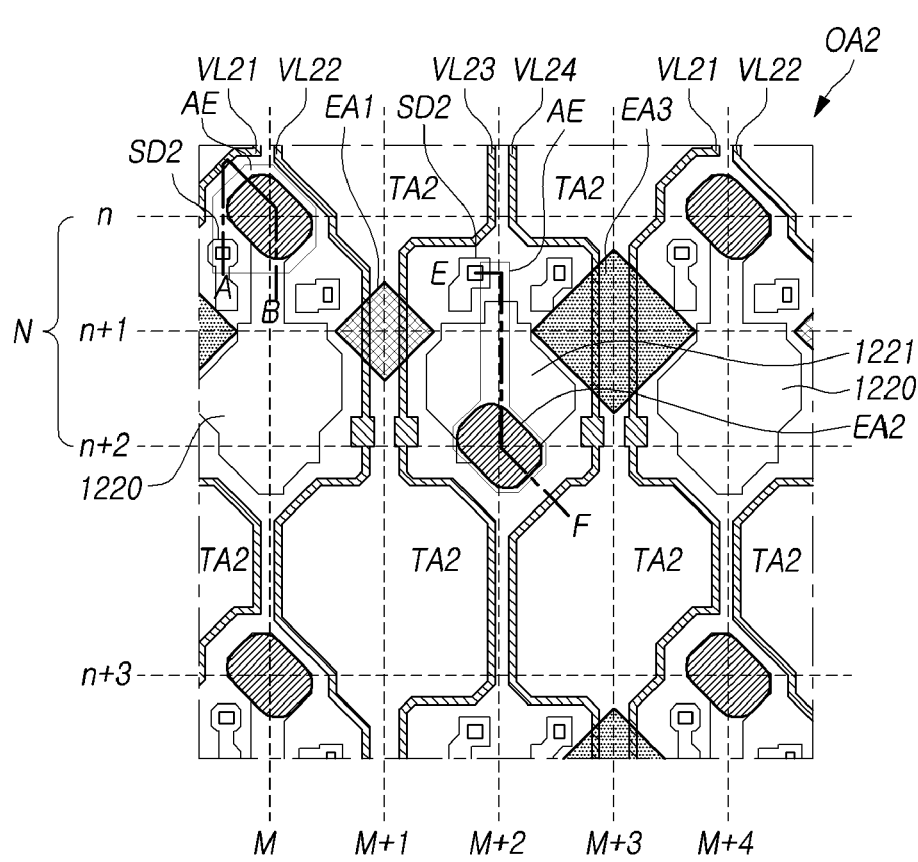
Figure 12C:
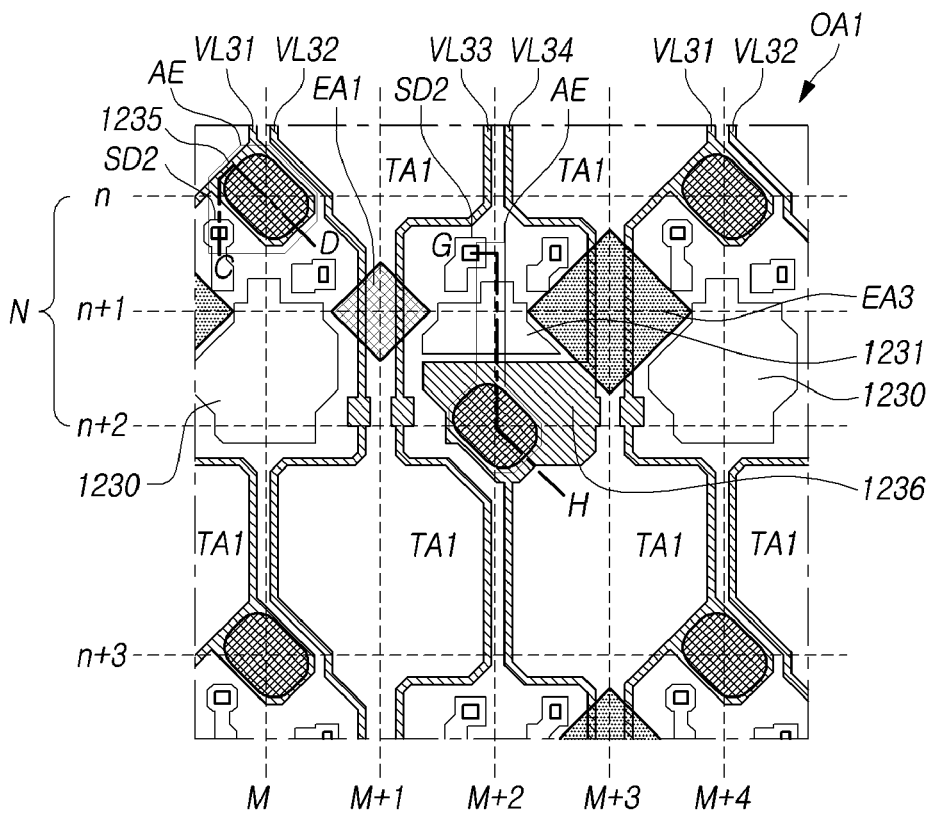

FIGS. 12B and 12C illustrate the structure of the first optical area OA1 is different from the structure of the second optical area OA2 in a plan. However, embodiments of the present disclosure are not limited thereto. For example, the structure of the second optical area OA2 can be the same as that of the first optical area OA1.

Referring to FIGS. 12A and 12C, a plurality of vertical lines (VL11, VL12, VL13, VL14, VL31, VL32, VL33 and VL34) are disposed in the normal area NA and the first optical area OA1. Among the vertical lines disposed on the display panel 110, a plurality of vertical lines (VL11, VL12, VL13, and VL14) are disposed in the normal area NA, a plurality of vertical lines (VL31, VL32, VL33, and VL34) are disposed in the first optical area OA1, and a plurality of vertical lines (VL21, VL22, VL23, and VL24) are disposed in the second optical area OA2 The plurality of vertical lines disposed in the first and second optical areas OA1 and OA2 can also be disposed in the normal area NA.

Referring to FIGS. 12A-12C, among the vertical lines, not only data lines DL and driving voltage lines DVL, but reference voltage lines, initialization voltage lines, and the like can be further disposed in the display panel 110, For example, the plurality of vertical lines (VL11, VL12, VL13, VL14, VL21, VL22, VL23, VL24, VL31, VL32, VL33, VL34) can be data lines DL, driving voltage lines DVL, reference voltage lines, initialization voltage lines, and the like.

In addition, the term "vertical" in the plurality of vertical lines (VL11, VL12, VL13, VL14, VL21, VL22, VL23, VL24, VL31, VL32, VL33, and VL34) can mean only that a signal is carried from an upper portion, to a lower portion, of the display panel (or from the lower portion to the upper portion), and may not mean that the vertical lines VLn run in a straight line only in the direct vertical direction.

For example, in FIGS. 12A and 12C, the vertical lines (VL11, VL12, VL13, and VL14) arranged in the normal area NA are illustrated in a straight line; however, in another example, the vertical lines (VL11, VL12, VL13, and VL14) arranged in the normal area NA can include bent, folded or rolled portions. Likewise, the vertical lines (VL31, VL32, VL33, VL34, VL21, VL22, VL23, and VL24) disposed in the first and second optical areas OA1 and OA2 can also include bent, folded or rolled portions.

Referring to FIG. 12A, a plurality of light emitting areas (EA1, EA2, and EA3), first vertical line, second vertical line, third vertical line and fourth vertical line (VL11, VL12, VL13, and VL14) for driving the light emitting areas (EA1, EA2, and EA3), and a plurality of plates 1210 are disposed in the normal area NA. Each plate 1210 can be an element to which a high potential driving voltage Vdd is applied. Referring to FIG. 12A, the vertical lines (VL11, VL12, VL13, and VL14) in the normal area NA can be disposed in column M+1, column M+3, and the like, and overlap pluralities of first and third light emitting areas EA1 and EA3. For example, two vertical lines can be disposed between two plates 1210.

The arrangements of the light emitting areas (EA1, EA2, and EA3) included in the normal area NA can be different from those of pluralities of light emitting areas (EA1, EA2, and EA3) included in the first and second optical areas OA1 and OA2. In the normal area NA, light emitting areas (EA1, EA2, and EA3) can be spaced apart from each other in a plurality of sub-rows (n, n+1, n+2, . . . ) and a plurality of columns.

For example, a plurality of second light emitting areas EA2 can be spaced apart from each other in a first sub-row (n), and pluralities of first and third light emitting areas EA1 and EA3 can be alternately disposed in a second sub-row (n+1). Further, a plurality of second light emitting areas EA2 can be spaced apart from each other in a third sub-row (n+2), and pluralities of first and third light emitting areas EA1 and EA3 can be alternately disposed in a fourth sub-row (n+3).

Referring to FIGS. 12B and 12C, rows N where light emitting areas are disposed in the first and second optical areas OA1 and OA2 can have a zigzag shape as shown in FIG. 8. A plurality of second light emitting areas EA2 can be spaced apart from each other in a first sub-row (n) of the first and second optical areas OA1 and OA2, and pluralities of first and third light emitting areas EA1 and EA3 can be alternately spaced apart from each other in a second sub-row (n+1) thereof.

Referring to FIG. 12A, in the normal area NA, a light emitting area can be disposed in each row and each sub-column. In the first and second optical areas OA1 and OA2, when a light emitting area is disposed in one sub-row in each column, another light emitting area may not be disposed in a next sub-row adjacent to the one sub-row. For example, a second light emitting area EA2 can be disposed in the first sub-row (n) and column M, and another light emitting area may not be disposed in the second sub-row (n+1) and column M, and a second light emitting area EA2 can be disposed in the third sub-row (n+2) and column M.

However, in an example where this structure is applied to the first and second optical areas OA1 and OA2, respective transmittances of first and second transmission areas TA1 and TA2 can be reduced as the first and second transmission areas TA1 and TA2 overlap vertical lines. Accordingly, as illustrated in FIGS. 12A-12C, shapes of the plurality of vertical lines (VL31, VL32, VL33, VL34, VL21, VL22, VL23, and VL24) disposed in the first and second optical areas OA1 and OA2 can be different from shapes of the plurality of vertical lines (VL11, VL12, VL13, and VL14) disposed in the normal area NA.

In the first optical area OA1, a second light emitting area EA2 and a first plate 1230 can be disposed between first and second vertical lines VL31 and VL32. Further, a first transmission area TA1 can be disposed between second and third vertical lines VL32 and VL33. Respective portions of the second and third vertical lines VL32 and VL33 can overlap a first light emitting area EA1.

A second light emitting area EA2 and a second plate 1231 can be disposed between third and fourth vertical lines VL33 and VL34 of the first optical area OA1. The first transmission area TA1 can be disposed between the fourth and first vertical lines VL34 and VL31 of the first optical area OA1. Respective portions of the fourth and first vertical lines VL34 and VL31 can overlap a third light emitting area EA3.

In the second optical area OA2, a second light emitting area EA2 and a third plate 1220 can be disposed between first and second vertical lines VL21 and VL22. A second transmission area TA2 can be disposed between second and third vertical lines VL22 and VL23 of the second optical area OA2. Respective portions of the second and third vertical lines VL22 and VL23 can overlap a first light emitting area EA1.

A second light emitting area EA2 and a fourth plate 1221 can be disposed between third and fourth vertical lines VL23 and VL24 in the second optical area OA2. The second transmission area TA2 can be disposed between the fourth and first vertical lines VL24 and VL21 of the second optical area OA2. Respective portions of the fourth and first vertical lines VL34 and VL31 of the second optical area OA2 can overlap a third light emitting area EA3.

Referring to FIG. 12C, at least one second light emitting area EA2 of the first optical area OA1 can overlap at least one first branch pattern 1235. The at least one first branch pattern 1235 can be a pattern bifurcated from the first vertical line VL31 disposed in the same layer as a second source-drain electrode pattern SD2 electrically connected to an anode electrode AE of an organic light emitting element ED disposed in the second light emitting area EA2. At least one second light emitting area EA2 disposed adjacent to the first vertical line VL21 of the second optical area OA2 can overlap the third plate 1220 disposed between the first and second vertical line VL21 and VL22.

As illustrated in 12B, the third plate 1220 disposed in the second optical area OA2 can be spaced apart from the first vertical line VL21 and the second vertical line VL22 of the second optical area OA2. However, a short circuit can be formed when the third plate 1220 of the second optical area OA2 contacts the first vertical line VL21 and the second vertical line VL22.

To address this issue, in the second optical area OA2, so the third plate 1220 overlapping the second light emitting area EA2 can be spaced apart from the first and second vertical lines VL21 and VL22, the first and second vertical lines VL21 and VL22 can be bent from the second light emitting area EA2 toward the second transmission area TA2. In particular, when the first vertical line VL21 of the second optical area OA2 located close to the third plate 1220 penetrates into the second transmission area TA2, the transmittance of the second transmission area TA2 can be lowered.

As illustrated in 12C, in the first optical area OA1, as a size of the first plate 1230 disposed between the first vertical line VL31 and the second vertical line VL32 is designed to be smaller than a size of the third plate 1220 disposed in the second optical area OA2, and the first branch pattern 1235 bifurcated from the first vertical line VL31 of the first optical area OA1 is provided, each vertical line VL31 and VL32 in the first optical area OA1 need not be bent toward the first transmission area TA1 so the first plate 1230 disposed between the first vertical line VL31 and the second vertical line VL32 can be spaced apart from the first vertical line VL31 and the second vertical line VL32.

Thus, in the first optical area OA1, because the second light emitting area EA2 disposed between the first vertical line VL31 and the second vertical line VL32 is disposed to overlap the first branch pattern 1235, the transmittance of the first transmission area TA1 is improved. Referring to FIG. 12B, the fourth plate 1221 disposed in the second optical area OA2 can be spaced apart from the third and fourth vertical lines VL23 and VL24 of the second optical area OA2. However, in the second optical area OA2, a short circuit can be formed when the fourth plate 1221 contacts the third vertical line VL23 and the fourth vertical line VL24.

To address this issue, in the second optical area OA2, so the fourth plate 1221 overlapping the second light emitting area EA2 can be spaced apart from the third vertical line VL23 and the fourth vertical line VL24, the third and fourth vertical lines VL23 and VL24 can be bent from the second light emitting area toward the second transmission area TA2. In particular, when the fourth vertical line VL24 of the second optical area OA2 located close to the fourth plate 1221 penetrates into the second transmission area TA2, the transmittance of the second transmission area TA2 can be lowered.

As illustrated in FIG. 12C, in the first optical area OA1, as a size of the second plate 1231 disposed between the third vertical line VL33 and the fourth vertical line VL34 is designed to be smaller than a size of the fourth plate 1221 disposed in the second optical area OA2, and a second branch pattern 1236 bifurcated from the fourth vertical line VL34 of the first optical area OA1 is provided, each vertical line VL33 and VL34 in the first optical area OA1 need not be bent toward the first transmission area TA1 so the second plate 1231 disposed between the third vertical line VL33 and the fourth vertical line VL34 can be spaced apart from the third vertical line VL33 and the fourth vertical line VL34.

Thus, in the first optical area OA1, because the second light emitting area EA2 disposed between the third and fourth vertical lines VL33 and VL34 is disposed to overlap the second branch pattern 1236 the transmittance of the first transmission area TA1 is improved.

Figure 13:
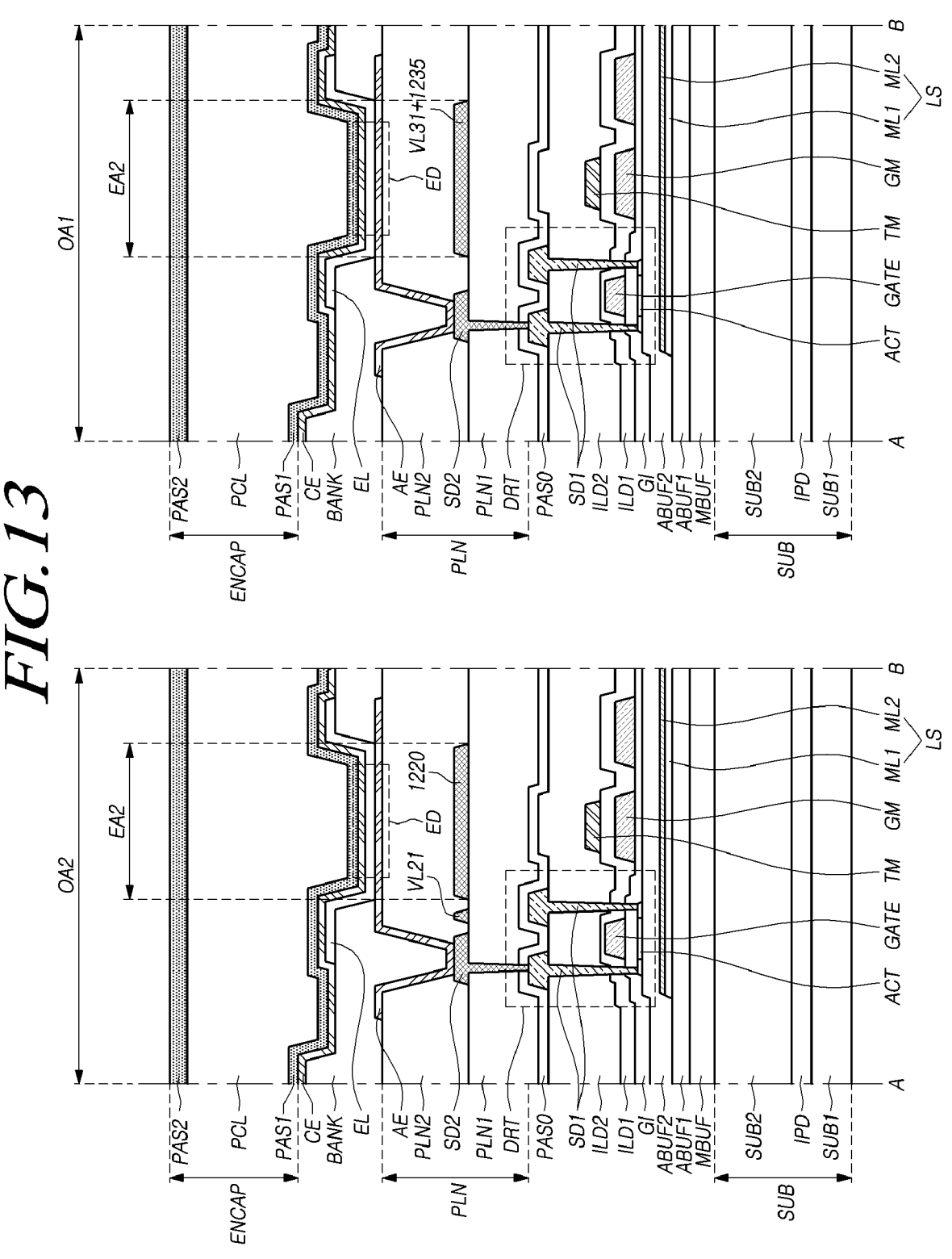
FIG. 13 are cross-sectional views taken along line A-B of FIG. 12B and line C-D of FIG. 12C.

The foregoing structures will be discussed with reference to FIGS. 13 and 14. In particular, FIG. 13 is a cross-sectional view taken along line A-B of FIG. 12B and line C-D of FIG. 12C. Also, FIG. 14 is a cross-sectional view taken along line E-F of FIG. 12B and line G-H of FIG. 12C.

Figure 14:
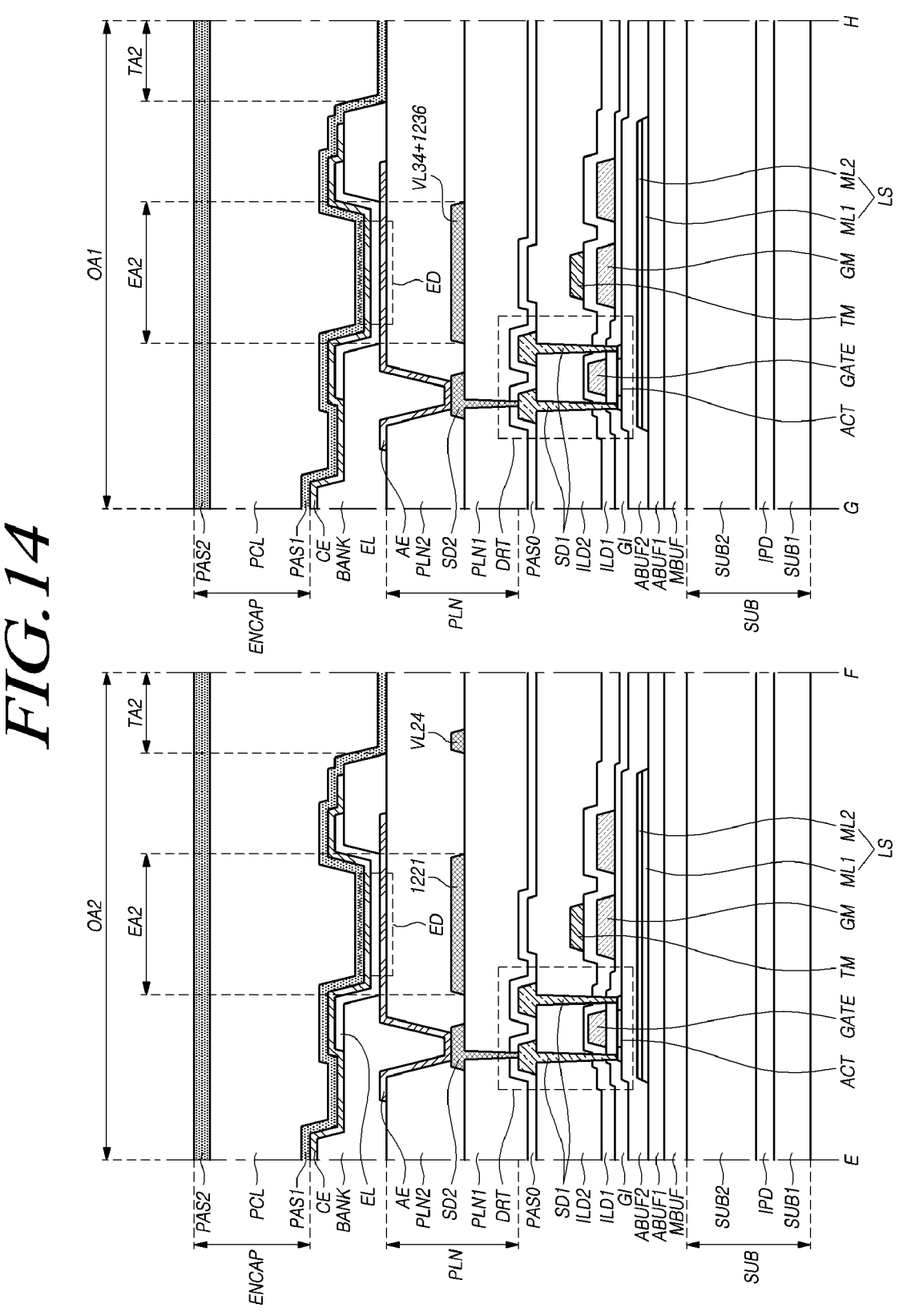
FIG. 14 are cross-sectional views taken along line E-F of FIG. 12B and line G-H of FIG. 12C.

In FIGS. 13 and 14, a stacked structure of the second light emitting area EA2 and a circuit area for driving the second light emitting area EA2, that is, a structure including a driving transistor DRT disposed on a substrate SUB, an organic light emitting element ED disposed over the driving transistor DRT, and an encapsulation layer ENCAP disposed on the organic light emitting element ED, can be the same as that of the normal area NA illustrated in FIG. 6.

As illustrated in FIG. 13, the second light emitting area EA2 and the third plate 1220 overlap in a portion of the second optical area OA2. The third plate 1220 is also spaced apart from the first vertical line VL21 of the second optical area OA2. In addition, the second light emitting area EA2 and the first branch pattern 1235 can overlap in a portion of the first optical area OA1. The first branch pattern 1235 can also be integrally formed with the first vertical line VL31 of the first optical area OA1.

Further, as illustrated in FIG. 14, the second light emitting area EA2 and the fourth plate 1221 overlap in a portion of the second optical area OA2. The fourth plate 1221 is also spaced apart from the fourth vertical line VL24 of the second optical area OA2. As the fourth plate 1221 is spaced apart from the fourth vertical line VL24, at least a portion of the fourth vertical line VL24 can be disposed in the second transmission area TA2

As illustrated in FIG. 14, the second light emitting area EA2 and the second branch pattern 1236 overlap in a portion of the first optical area OA1. The second branch pattern 1236 can be integrally formed with the fourth vertical line VL34 of the first optical area OA1. Thus, as a width of a portion of the circuit area of the first optical area OA1 is reduced by a width of one vertical line and a separation distance between the one vertical line and the plate, and a width of the first transmission area is increased by a reduction in width of the circuit area, the transmittance of the first transmission area TA1 can be improved.

As described above, the display device according to an aspect of the present disclosure includes a display panel 110 having a display area DA including a first optical area OA1 and a normal area NA positioned outside of the first optical area OA1, and a non-display area NDA. A plurality of signal lines are also included. The first optical area OA1 includes a plurality of light emitting areas (EA1, EA2, and EA3) and a plurality of first transmission areas TA1, and the normal area NA includes a plurality of light emitting areas (EA1, EA2, and EA3). The light emitting areas (EA1, EA2, and EA3) disposed in the first optical area OA1 can be disposed in a plurality of rows, and one or more of the plurality of light emitting areas (EA1, EA2, and EA3) in each row can be disposed in a zigzag shape. Among the plurality of signal lines, a plurality of first horizontal lines (HL1, HL11, HL12, HL13, HL14, HL15, HL16, and HL17) can extend from the normal area NA up to the first optical area OA1, and in the first optical area OA1, one or more of the plurality of first horizontal lines (HL1, HL11, HL12, HL13, HL14, HL15, HL16, and HL17) can overlap of the plurality of light emitting areas (EA1, EA2, and EA3) and have a zigzag shape.

The display area DA can further include a second optical area OA2 different from the first optical area OA1 and the normal area NA; the plurality of first horizontal lines run through the first optical area and the second optical area, and a plurality of second horizontal lines are disposed in the normal area without running through the first optical area and the second optical area, and a number of subpixels connected to of the first horizontal lines can be different from a number of subpixels connected to of the second horizontal lines. The number of subpixels connected to of the first horizontal lines can be smaller than the number of subpixels connected to of the second horizontal lines.

Each of the plurality of rows can include bent vertexes bent at an acute angle, and include a first sub-row, a second sub-row, and a third sub-row, and the first sub-row and the third sub-row correspond to the bent vertexes. The light emitting areas (EA1, EA2, and EA3) of the first optical area OA1 can emit light of different colors and include first light emitting areas EA1, second light emitting areas EA2, and third light emitting areas EA3, which are spaced apart from one another. Each of the light emitting areas (EA1, EA2, and EA3) can overlap a circuit area CA for driving the plurality of light emitting areas.

One or more of the first horizontal lines (HL1, HL11, HL12, HL13, HL14, HL15, HL16, and HL17) can overlap the circuit area CA. In the first optical area OA1, each of a plurality of rows in which the light emitting areas (EA1, EA2, and EA3) are disposed can include one or more bent vertexes bent at an acute angle. The first light emitting areas EA1 and the third light emitting areas EA3 can be alternately disposed at the bent vertexes. The second light emitting area EA2 can be disposed between the first light emitting areas EA1 and the third light emitting areas EA3.

In the first optical area OA1, each of the plurality of rows in which the light emitting areas (EA1, EA2, and EA3) are disposed can include bent vertexes bent at an acute angle. The second light emitting areas EA2 can be disposed at the bent vertexes. The first light emitting areas EA1 and the third light emitting area EA3 can be alternately disposed between adjacent second light emitting areas EA2 among two or more of the second light emitting areas EA2.

The first horizontal lines (HL1, HL11, HL12, HL13, HL14, HL15, HL16, and HL17) in the normal area NA can extend in a direction different from a direction in which the first horizontal lines (HL1, HL11, HL12, HL13, HL14, HL15, HL16, and HL17) extend in the first optical area OA1. Among the plurality of signal lines, a plurality of second horizontal lines can be disposed in the normal area NA, and the second horizontal lines can extend in a direction corresponding to a direction in which the first horizontal lines (HL1, HL11, HL12, HL13, HL14, HL15, HL16 and HL17) extend in the normal area NA.

Among the plurality of signal lines, a plurality of vertical lines can be disposed in the normal area NA and the first optical area OA1, and shapes of the vertical lines (VL11, VL12, VL13, VL14, VL31, VL32, VL33, and VL34) disposed in the normal area can be different from shapes of the vertical lines (VL11, VL12, VL13, VL14, VL31, VL32, VL33, and VL34) disposed in the first optical area OA1. The vertical lines (VL31, VL32, VL33 and VL34) in the first optical area OA1 can include a first vertical line VL31, a second vertical line VL32 disposed on one side of the first vertical line VL31, a third vertical line VL33 disposed on one side of the second vertical line VL32, and a fourth vertical line VL34 disposed on one side of the third vertical line VL33.

At least one second light emitting area EA2 is disposed between the first vertical line VL31 and the second vertical line VL32, and the at least one second light emitting area EA2 can overlap at least one first branch pattern 1235 bifurcated from the first vertical line VL31. The at least one first branch pattern 1235 may not overlap at least one first transmission area TA1 of the first optical area OA1.

At least one second light emitting area EA2 is disposed between the third vertical line VL33 and the fourth vertical line VL34, and the at least one second light emitting area EA2 can overlap at least one second branch pattern 1236 bifurcated from the fourth vertical line VL34. The at least one second branch pattern 1236 may not overlap at least one first transmission area TA1 of the first optical area OA1.

A fourth vertical line VL34 can be disposed on the other side of the first vertical line VL31, and the first vertical line VL31 and the fourth vertical line VL34 can overlap at least one third light emitting area EA3, and the second vertical line VL32 and the third vertical line VL33 can overlap at least one first light emitting area EA1. In the display device, a first optical electronic device 11 can be located under, or in a lower portion of, the display panel 110 and overlap at least a portion of the first optical area OA1 included in the display area DA.

The display area DA can further include a second optical area OA2 different from the first optical area OA1 and the normal area NA. The display device can further include a second optical electronic device 12 located under, or in a lower portion of, the display panel 110, and overlapping at least a portion of the second optical area OA2. The normal area NA can be or may not be disposed between the first optical area OA1 and the second optical area OA2.

Among the plurality of signal lines, a plurality of vertical lines (VL21, VL22, VL23, and VL24) can be disposed in the normal area NA and the second optical area OA2, and the plurality of vertical lines (VL21, VL22, VL23, and VL24) in the second optical area OA2 can include a first vertical line VL21, a second vertical line VL22 disposed on one side of the first vertical line VL21, a third vertical line disposed on one side of the second vertical line VL23, and a fourth vertical line VL24 disposed on one side of the third vertical line VL23.

In the second optical area OA2, at least one second light emitting area EA2 can be disposed between the first vertical line VL21 and the second vertical line VL22, and at least one second light emitting area EA2 can be disposed between the third vertical line VL23 and the fourth vertical line VL24. The at least one second light emitting area EA2 disposed between the first vertical line VL21 and the second vertical line VL22 can be spaced apart from the first vertical line VL21 and the second vertical line VL22, and the at least one second light emitting area EA2 disposed between the third vertical line VL23 and the fourth vertical line VL24 can be spaced apart from the third vertical line VL23 and the fourth vertical line VL24. The second optical area OA2 further includes a plurality of second transmission areas TA2, and in the second optical area OA2, respective portions of the first vertical line VL21 and the fourth vertical line VL24 can overlap one or more of the plurality of the second transmission area TA2.

According to an aspect of the present disclosure, the display panel 110 is provided that includes: a display area DA including a first optical area OA1 and a normal area NA located outside of the first optical area OA1, and a non-display area NDA; and a plurality of signal lines. The first optical area OA1 can include a plurality of light emitting areas (EA1, EA2, and EA3) and a plurality of first transmission areas TA1, and the normal area NA can include a plurality of light emitting areas (EA1, EA2, and EA3). The plurality of light emitting areas (EA1, EA2, and EA3) disposed in the first optical area OA1 can be disposed in a plurality of rows, and two or more light emitting areas among the plurality of light emitting areas (EA1, EA2, and EA3) in each of the plurality of rows can be disposed in a zigzag shape. A plurality of first horizontal lines (HL1, HL11, HL12, HL13, HL14, HL15, HL16, and HL17) among the plurality of signal lines can extend from the normal area NA up to the first optical area OA1, and of the plurality of first horizontal lines (HL1, HL11, HL12, HL13, HL14, HL15, HL16, and HL17) in the first optical area can overlap of the plurality of light emitting areas (EA1, EA2, and EA2) and have a zigzag shape. A plurality of vertical lines (VL11, VL12, VL13, VL14, VL31, VL32, VL33, and VL34) among the plurality of signal lines can be disposed in the normal area NA and the first optical area OA1, and at least one branch pattern (1235, and/or 1236) bifurcated from at least one vertical line among the plurality of vertical lines (VL11, VL12, VL13, VL14, VL31, VL32, VL33, and VL34) can overlap at least one light emitting area EA2 of the first optical area OA1.

According to the embodiments described herein, a display panel and a display device can be provided that are capable of reducing a non-display area of the display panel and enabling an optical electronic device such as a camera, a sensor, and/or the like not to be exposed in the front surface of the display panel by disposing the optical electronic device under a display area, or in a lower portion, of the display panel. According to the embodiments described herein, a display panel and a display device can be provided that include a plurality of first horizontal lines having a zigzag shape, and thereby, are capable of facilitating light emitting in light emitting areas and improving transmittance in an optical area.

According to the embodiments described herein, a display panel and a display device can be provided that have a light transmission structure for enabling an optical electronic device under the display area, or in a lower portion, of the display panel to normally receive or detect light transmitting the display panel. According to the embodiments described herein, a display panel and a display device can be provided that are capable of normally performing display driving in an optical area included in a display area of the display panel and overlapping an optical electronic device.

The above description has been presented to enable any person skilled in the art to make and use the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. Although the exemplary embodiments have been described for illustrative purposes, a person skilled in the art will appreciate that various modifications and applications are possible without departing from the essential characteristics of the present disclosure. For example, the specific components of the exemplary embodiments can be variously modified. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure is to be construed according to the claims, and all technical ideas within the scope of the claims should be interpreted as being included in the scope of the present disclosure.

What is claimed is:

1. A display device comprising: a display panel including a plurality of light emitting areas; a first optical electronic device located under the display panel; a second optical electronic device located under the display panel, wherein a first optical area of the display panel overlapping the first optical electronic device comprises a plurality of first light transmission areas in addition to the plurality of light emitting areas, wherein a second optical area of the display panel overlapping the second optical electronic device comprises a plurality of second light transmission areas in addition to the plurality of light emitting areas, wherein a third optical area of the display panel is free from overlapping the first and second optical electronic devices includes the plurality of light emitting areas without including the first and second light transmission areas, wherein the first optical area includes first zigzag rows of the light emitting areas and second zigzag rows of first horizontal signal lines overlapping the first zigzag rows of the light emitting areas, wherein the second zigzag rows correspond to the first zigzag rows, and wherein the first horizontal signal lines are free from overlap with the plurality of first light transmission areas.

2. The display device according to claim 1, further comprising:
   a plurality of second horizontal signal lines disposed in the third optical area without running through the first optical area and the second optical area,
   wherein the first horizontal signal lines run through the first optical area and the second optical area, and
   wherein a number of subpixels connected to the first horizontal signal lines is different from a number of subpixels connected to the second horizontal signal lines.

3. The display device according to claim 2, wherein the number of subpixels connected to the first horizontal signal lines is smaller than the number of subpixels connected to the second horizontal signal lines.

4. The display device according to claim 1, wherein each first zigzag row of the light emitting areas includes bent vertexes bent at an acute angle, and a first sub-row, a second sub-row, and a third sub-row, and
   wherein the first sub-row and the third sub-row correspond to the bent vertexes.

5. The display device according to claim 1, wherein the plurality of light emitting areas in the first optical area emit light of different colors, and include first light emitting areas, second light emitting areas, and third light emitting areas, which are spaced apart from one another and overlap a circuit area for driving the light emitting areas.

6. The display device according to claim 5, wherein the first horizontal signal lines overlap the circuit area in the first optical area.

7. The display device according to claim 5, wherein each first zigzag row of the light emitting areas includes bent vertexes bent at an acute angle,
   wherein the first light emitting areas and the third light emitting areas are alternately disposed at the bent vertexes, and
   wherein the second light emitting areas are disposed between the first light emitting areas and the third light emitting areas.

8. The display device according to claim 5, wherein each first zigzag row of the light emitting areas includes bent vertexes bent at an acute angle,
   wherein the second light emitting areas are disposed at each of the bent vertexes, and wherein the first light emitting areas and the third light emitting areas are alternately disposed between adjacent second light emitting areas.

9. The display device according to claim 5, further comprising:
   a plurality of vertical signal lines disposed in the third optical area and the first optical area, and
   wherein a shape of the vertical signal lines disposed in the third optical area is different from a shape of the vertical signal lines disposed in the first optical area.

10. The display device according to claim 9, wherein the vertical signal lines disposed in the first optical area comprise a first vertical line, a second vertical line disposed on one side of the first vertical line, a third vertical line disposed on one side of the second vertical line, and a fourth vertical line disposed on one side of the third vertical line.

11. The display device according to claim 10, wherein the second light emitting areas are disposed between the first vertical line and the second vertical line, and the second light emitting areas overlap first branch patterns bifurcated from the first vertical line.

12. The display device according to claim 11, wherein the first branch patterns do not overlap the plurality of light emitting areas of the first optical area.

13. The display device according to claim 10, wherein the second light emitting areas are disposed between the third vertical line and the fourth vertical line, and the second light emitting areas overlap second branch patterns bifurcated from the fourth vertical line.

14. The display device according to claim 13, wherein the second branch patterns do not overlap the light emitting areas of the first optical area.

15. The display device according to claim 10, wherein the fourth vertical line is disposed on the other side of the first vertical line, and the first vertical line and the fourth vertical line overlap the third light emitting areas, and the second vertical line and the third vertical line overlap the first light emitting areas.

16. The display device according to claim 1, wherein the first horizontal signal lines in the third optical area extend in a direction different from a direction in which the first horizontal signal lines extend in the first optical area.

17. The display device according to claim 1, further comprising:
   a plurality of second horizontal signal lines disposed in the third optical area,
   wherein the second horizontal signal lines extend in a direction corresponding to a direction in which the first horizontal signal lines extend in the third optical area.

18. The display device according to claim 1, wherein the third optical area is disposed between the first optical area and the second optical area.

19. The display device according to claim 18, further comprising:
   a plurality of vertical signal lines disposed in the third optical area and the second optical area, and
   wherein the vertical signal lines disposed in the second optical area comprise a first vertical line, a second vertical line disposed on one side of the first vertical line, a third vertical line disposed on one side of the second vertical line, and a fourth vertical line disposed on one side of the third vertical line.

20. The display device according to claim 19, wherein in the second optical area, the light emitting areas are disposed between the first vertical line and the second vertical line, and the light emitting areas are disposed between the third vertical line and the fourth vertical line, and wherein the light emitting areas disposed between the first vertical line and the second vertical line are spaced apart from the first vertical line and the second vertical line, and the light emitting areas disposed between the first vertical line and the second vertical line are spaced apart from the third vertical line and the fourth vertical line.

\* \* \* \* \*